(12) United States Patent
Chien et al.

(10) Patent No.: US 12,274,176 B2
(45) Date of Patent: Apr. 8, 2025

(54) METHOD OF MANUFACTURING MRAM DEVICE WITH ENHANCED ETCH CONTROL

(71) Applicant: TAIWAN SEMICONDUCTOR MANUFACTURING COMPANY, LTD., Hsinchu (TW)

(72) Inventors: Yu-Jen Chien, Hsinchu (TW); Jung-Tang Wu, Kaohsiung (TW); Szu-Hua Wu, Zhubei (TW); Chin-Szu Lee, Taoyuan (TW); Meng-Yu Wu, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/230,358

(22) Filed: Aug. 4, 2023

(65) Prior Publication Data

US 2023/0380291 A1   Nov. 23, 2023

Related U.S. Application Data

(62) Division of application No. 17/168,974, filed on Feb. 5, 2021, now Pat. No. 11,985,904.

(Continued)

(51) Int. Cl.
*H10N 50/01* (2023.01)
*H10B 61/00* (2023.01)
*H10N 50/80* (2023.01)

(52) U.S. Cl.
CPC ............. *H10N 50/01* (2023.02); *H10B 61/22* (2023.02); *H10N 50/80* (2023.02)

(58) Field of Classification Search
CPC ........ H10N 50/01; H10N 50/80; H10N 50/10; H10N 50/85; H10B 61/22
(Continued)

(56) References Cited

U.S. PATENT DOCUMENTS 10,199,431 B2   2/2019  Jeong
10,381,403 B1*  8/2019  Jiang ................. H10N 50/01
(Continued)

FOREIGN PATENT DOCUMENTS

| CN | 108288670 A | 7/2018 |
| CN | 109979961 A | 7/2019 |
| TW | 201923981 A | 6/2019 |

OTHER PUBLICATIONS

Non-Final Office Action issued in U.S. Appl. No. 17/168,974, dated Mar. 7, 2023.
(Continued)

*Primary Examiner* — Jami Valentine Miller
*Assistant Examiner* — Pratiksha Jayant Lohakare
(74) *Attorney, Agent, or Firm* — STUDEBAKER BRACKETT PLLC

(57) ABSTRACT

A method of manufacturing a semiconductor device includes: forming a substrate over the substrate, the substrate defining a logic region and a memory region; depositing a bottom electrode layer across the logic region and the memory region; depositing a magnetic tunnel junction (MTJ) layer over the bottom electrode layer; depositing a first conductive layer over the MTJ layer; depositing a sacrificial layer over the first conductive layer; etching the sacrificial layer in the memory region to expose the first conductive layer in the memory region while keeping the first conductive layer in the logic region covered; depositing a second conductive layer in the memory region and the logic region; patterning the second conductive layer to
(Continued)

expose the MTJ layer in the memory region; and etching the patterned second conductive layer and the MTJ layer to form a top electrode and an MTJ, respectively, in the memory region.

20 Claims, 38 Drawing Sheets

Related U.S. Application Data

(60) Provisional application No. 63/014,081, filed on Apr. 22, 2020.

(58) Field of Classification Search
USPC .......................................................... 257/427
See application file for complete search history.

(56) References Cited

U.S. PATENT DOCUMENTS

| | | | |
|---|---|---|---|
| 10,446,607 B2* | 10/2019 | Yi | H10N 50/10 |
| 10,490,248 B2 | 11/2019 | Chuang et al. | |
| 11,005,032 B2 | 5/2021 | Chuang et al. | |
| 11,127,788 B2* | 9/2021 | Niu | G11C 11/161 |
| 2002/0173139 A1* | 11/2002 | Kweon | H10B 53/00 |
| | | | 257/E21.664 |
| 2003/0002330 A1* | 1/2003 | Nishimura | H10B 61/22 |
| | | | 365/158 |
| 2004/0191928 A1* | 9/2004 | Shi | B82Y 10/00 |
| | | | 257/E27.005 |
| 2010/0184239 A1* | 7/2010 | Matsuzaki | H10N 50/10 |
| | | | 216/22 |
| 2012/0135543 A1* | 5/2012 | Shin | H10B 61/22 |
| | | | 257/E43.006 |
| 2013/0171814 A1* | 7/2013 | Torii | H01L 28/40 |
| | | | 257/E21.422 |
| 2013/0249025 A1 | 9/2013 | Natori et al. | |
| 2014/0264679 A1* | 9/2014 | Lee | H10N 50/10 |
| | | | 257/427 |
| 2015/0249209 A1* | 9/2015 | Lu | H10N 50/80 |
| | | | 257/421 |
| 2016/0268507 A1 | 9/2016 | Tu et al. | |
| 2017/0054070 A1* | 2/2017 | Bak | H10N 50/01 |
| 2017/0279036 A1* | 9/2017 | Mo | H10N 50/10 |
| 2018/0197914 A1 | 7/2018 | Jeong | |
| 2018/0374895 A1 | 12/2018 | Hsu et al. | |
| 2019/0148633 A1 | 5/2019 | Dai et al. | |
| 2019/0273118 A1 | 9/2019 | Chuang et al. | |
| 2020/0127194 A1 | 4/2020 | Rizzolo et al. | |

OTHER PUBLICATIONS

Final Office Action issued in U.S. Appl. No. 17/168,974, dated Jun. 12, 2023.

* cited by examiner

METHOD OF MANUFACTURING MRAM DEVICE WITH ENHANCED ETCH CONTROL

PRIORITY CLAIM AND CROSS-REFERENCE

This application is a divisional of U.S. patent application Ser. No. 17/168,974 filed Feb. 5, 2021, which claims priority to U.S. Provisional Application Ser. No. 63/014,081 filed Apr. 22, 2020, the entire disclosure of each of which is hereby incorporated by reference.

BACKGROUND

Semiconductors are used in integrated circuits for electronic applications, including radios, television sets, cell phones, and personal computing devices. One type of well-known semiconductor devices is a semiconductor storage device, such as dynamic random access memories (DRAMs), or flash memories, both of which use charges to store information.

A more recent development in semiconductor memory devices involves a magnetoresistive random access memory (MRAM) using spin electronics, which combines a semiconductor technology and magnetic materials and devices. The spin polarization of electrons, rather than the charge of the electrons, is used to indicate the state of "1" or "0." One such spin electronic device is a magnetic tunneling junction (MTJ) device using spin torque transfer (STT).

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
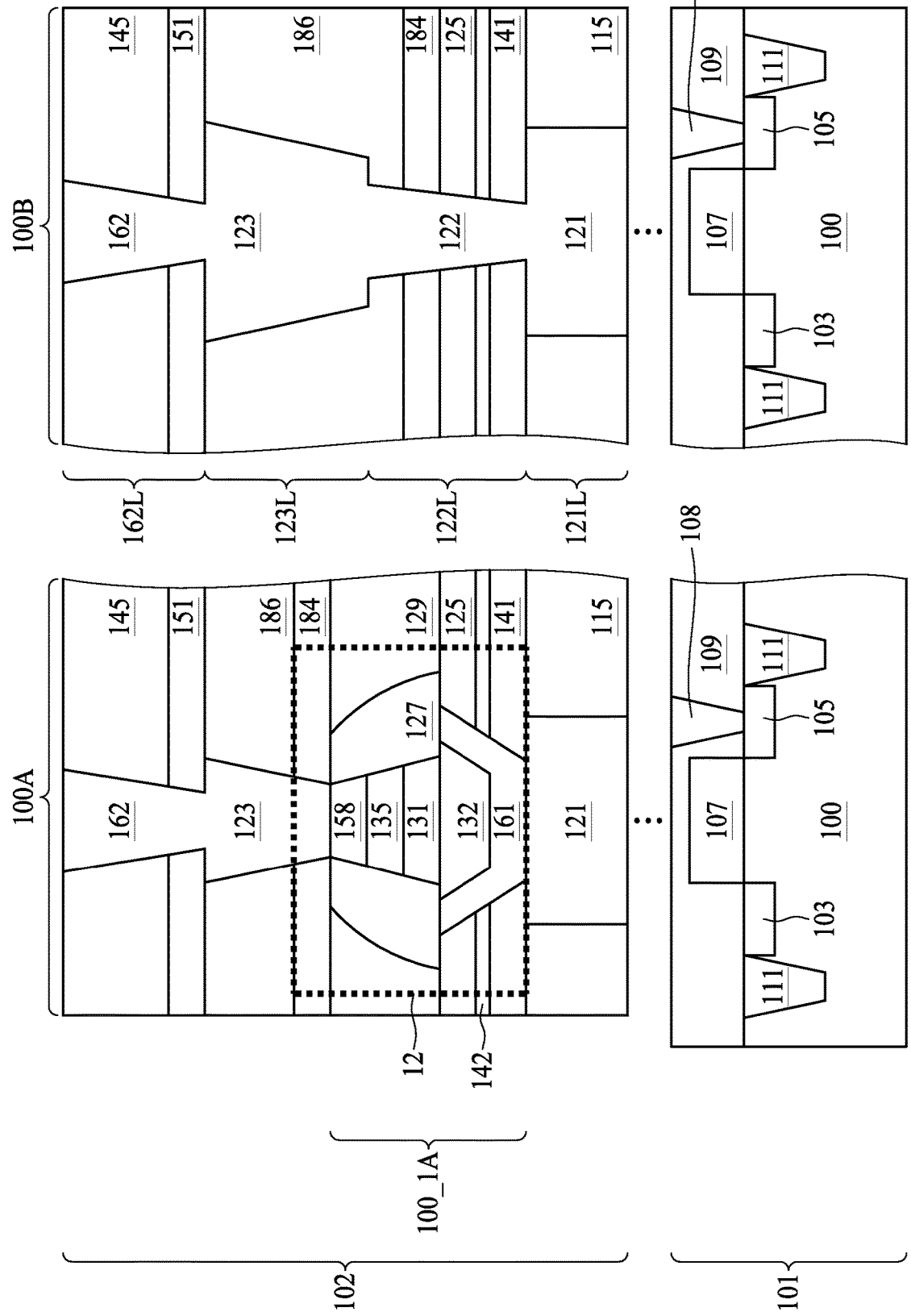
FIG. 1A is a cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

An MTJ device typically includes a free layer, a tunnel layer, and a pinned layer. The magnetization direction of the free layer can be reversed by applying a current through the tunnel layer, which causes the injected polarized electrons within the free layer to exert so-called spin torques on the magnetization of the free layer. The pinned layer has a fixed magnetization direction as reference. When a current flows in the direction from the free layer to the pinned layer, electrons flow in a reverse direction, that is, from the pinned layer to the free layer. The electrons are polarized to the same magnetization direction of the pinned layer after passing the pinned layer; flowing through the tunnel layer; and then into and accumulating in the free layer. Eventually, the magnetization of the free layer is parallel to that of the pinned layer, and the MTJ device will be at a low resistance state. The electron injection caused by current is referred to as a major injection.

When current flowing from the pinned layer to the free layer is applied, electrons flow in the direction from the free layer to the pinned layer. The electrons having the same polarization as the magnetization direction of the pinned layer are able to flow through the tunnel layer and into the pinned layer. Conversely, electrons with polarization differing from the magnetization of the pinned layer will be reflected (blocked) by the pinned layer and will accumulate in the free layer. Eventually, magnetization of the free layer becomes anti-parallel to that of the pinned layer, and the MTJ device will be at a high resistance state. The respective electron injection caused by current is referred to as a minor injection.

Embedded MRAM cells in a CMOS structure have been continuously developed. A semiconductor circuit with embedded MRAM cells defines a memory region and a logic region separated from the memory region. For example, the memory region may be located at the center of the semiconductor circuit, while the logic region may locate at a periphery of the semiconductor circuit. Note the previous statement is not intended to be limiting. Other arrangements regarding the memory region and the logic region are in the contemplated scope of the present disclosure.

In the memory region, a transistor structure can be disposed under the MRAM structure. In some embodiments, the MRAM cells are embedded in a metallization layer, or an interconnect layer, prepared in a back-end-of-line (BEOL) operation of a CMOS fabrication technology. For example, the transistor structures in the memory region and in the logic region are disposed in a common semiconductor substrate, prepared in a front-end-of-line operation of a CMOS fabrication technology, and are substantially identical to each other in the two regions in some embodiments. The MRAM cells can be embedded in any position of the metallization layers, for example, between adjacent metal line layers distributed horizontally parallel to the surface of the semiconductor substrate. For instance, the embedded MRAM cells can be located between the 4th metal line layer and the 5th metal line layer in the memory region. Horizontally shifted to the logic region, the metal line in the 4th metal line layer is connected to the metal line in the 5th metal line layer though a metal via in a 4th metal via layer between the 4th and 5th metal line layers. In other words, taking the memory region and the logic region into consideration, the embedded MRAM cells occupy a thickness of at least a portion of the 5th metal line layer. Throughout the present disclosure, the term "metal line layer" refers to the collection of the metal lines in the same Nth metal line layer, where N is an integer greater than or equal to 1. Similarly, throughout the present disclosure, the term "metal via layer" refers to the collection of the metal vias in the same Nth metal via layer, where N is an integer greater than or equal to 1. In general, the MRAM cells are located between an Nth metal line layer and an (N+1)th metal line layer. One having ordinary skill in the art can understand that the numbers provided for the metal line layers and the arrangement of the MRAM in the metallization layer described herein are not limiting.

The embedded MRAM includes a magnetic tunneling junction (MTJ) composed of ferromagnetic materials. A bottom electrode and a top electrode are electrically coupled to the MTJ for signal/bias application. Following the example previously provided, the bottom electrode is further connected to the Nth metal line layer, whereas the top electrode is further connected to the (N+1)th metal line layer.

Referring to FIG. 1A, FIG. 1A is a cross section of a semiconductor structure 10 in accordance with some embodiments of the present disclosure. The semiconductor structure 10 can be a semiconductor circuit including a memory region 100A and a logic region 100B. Each of the memory region 100A and the logic region 100B has a transistor structure 101 in a semiconductor substrate 100 and a metallization structure 102 arranged over the semiconductor substrate 100.

In some embodiments, the semiconductor substrate 100 may be but is not limited to, for example, a silicon substrate. In an embodiment, the semiconductor substrate 100 is provided or formed which includes semiconductor materials, such as a silicon substrate, although it may include other semiconductor materials, such as silicon germanium, silicon carbide, gallium arsenide, or the like. In the present embodiment, the semiconductor substrate 100 is a p-type semiconductor substrate (P-Substrate) or an n-type semiconductor substrate (N-Substrate) comprised of silicon. Alternatively, the semiconductor substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epitaxial layer, a gradient semiconductor layer, and/or a semiconductor layer overlying another semiconductor layer of a different type, such as a silicon layer on a silicon germanium layer. The semiconductor substrate 100 may or may not include doped regions, such as a P-well, an N-well, or combination thereof.

In some embodiments, a shallow trench isolation (STI) 111 is provided in the semiconductor substrate 100. The STI 111 is provided to electrically isolate a transistor structure from neighboring semiconductor devices such as other transistor structures. The STI 111 is formed of suitable dielectric materials, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 is also formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI 111 may also be formed of any suitable "low dielectric constant" or "low K" dielectric material, where K is less than or equal to about 3.8.

In some embodiments, the transistor structure 101 includes a gate region 107, a source region 103 and a drain region 105. The source region 103 and the drain region 105 are disposed at least partially in the semiconductor substrate 100. In some embodiments, the gate region 107 of the semiconductor structure 10 includes a polysilicon gate or a metal gate. The gate region 107 is disposed over a top surface of the semiconductor substrate 100 and between the source region 103 and the drain region 105. The semiconductor substrate 100 defines the memory region 100A and the logic region 100B, and both the memory region 100A and the logic region 100B include transistor structures 101. In some embodiments, the transistor structures 101 have similar configurations in the memory region 100A and in the logic region 100B. It is noted that only a planar-type transistor structure 101 is show in FIG. 1A for illustrative purposes, however, the present disclosure is not limited thereto. Any non-planar transistors structures, such as a fin-type (FinFFT) transistor structure, are within the contemplated scope of the present disclosure.

The semiconductor structure 10 may further include a contact plug 108 arranged in an inter-layer dielectric (ILD) 109, and may be electrically coupled to the gate region 107 of the transistor structure 101. In some embodiments, the ILD 109 is formed over the semiconductor substrate 100. A variety of techniques may be used for forming the ILD 109, e.g., chemical vapor deposition (CVD), low-pressure CVD (LPCVD), plasma-enhanced CVD (PECVD), sputtering and physical vapor deposition (PVD), thermal growing, and the like. The ILD 109 above the semiconductor substrate 100 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The metallization structure 102 is disposed above the transistor structure 101. Referring to the logic region 100B, the metallization structure 102 includes a plurality of metal line layers, e.g., an Nth metal line layer 121L and an (N+1)th metal line layer 123L, and an Nth metal via layer 122L and an (N+1)th metal via layer 162L. Metal lines 121 and 123 in the respective metal line layers 121L and 123L are interconnected through a metal via 122 in the Nth metal via layer 122L. The metal line 123 in the metal line layer 123L is electrically connected to overlying features through a metal via 162 in the (N+1)th metal via layer 162L. The metal lines 121 and 123 and the metal vias 122 and 162 are conductive lines and vias, respectively, and are formed of conductive materials, such as copper, tungsten, aluminum, gold, silver, alloys thereof and the like. Referring to the memory region 100A, metal line 123 has a reduced height as compared to the metal line 123 of the logic region 100B. An exemplary MRAM cell structure 100_1A is arranged between the Nth metal line 121 and the (N+1)th metal line 123 of the memory region 100A. Because the Nth metal line layer 121L may not be the first metal line layer over the transistor structure 101, a portion of the metallization structure 102 is omitted and represented by dots. In some embodiments, N is any integer from 3 to 10.

In some embodiments, the metal line or the metal via is laterally surrounded by a dielectric layer 115, 125, 186 or 145, respectively. Each of the dielectric layers 115, 125, 186 or 145 may be an inter-metal dielectric (IMD) layer and formed of oxides such as un-doped silicate glass (USG), fluorinated silicate glass (FSG), low-k dielectric materials, or the like. The low-k dielectric materials may have k values lower than 3.8, although the dielectric material of the IMD layers 115, 125, 186 or 145 may also be close to 3.8. In some embodiments, the k values of the low-k dielectric materials are lower than about 3.0, and may be lower than about 2.5.

In some embodiments, the metal line or the metal via is further laterally surrounded by a barrier layer or a stack of barrier layers 141, 142 and 143 (see, FIG. 3), respectively. In some embodiments, the barrier layers 141 through 143 include dielectric materials and serve as etch stop layers in etching trenches or recesses in the respective metal line layers or metal via layers, in which the conductive materials can be deposited into these trenches or recesses for forming metal lines and metal vias. In some embodiments, two or more of the barrier layers 141 through 143 are chosen to have different materials having different etching selectivity properties and are arranged in a stack for improving the etching performance. For example, in some embodiments, the barrier layer 141 is formed of silicon oxide, silicon nitride, silicon oxynitride or silicon carbide. In some embodiments, the barrier layer 142 is aluminum oxide. In some embodiments, the barrier layer 143 is formed of silicon oxide, silicon nitride, silicon oxynitride or silicon carbide.

In FIG. 1A, the MRAM structure 100_1A at least includes a bottom electrode via (BEVA) 132, a bottom electrode 131, an MTJ 135 and a top electrode 158. In some embodiments, the BEVA 132 is formed over and electrically coupled to the Nth metal line 121. In some embodiments, the BEVA 132 is laterally surrounded by the IMD layer 125 and the dielectric stack formed of the barrier layers 141 and 142. The BEVA 132 may be formed in a trench possessing a trapezoidal recess. In some embodiments, the BEVA 132 may include conductive materials such as TiN, TaN, Ta or other suitable materials.

In some embodiments, a lining layer 161 is formed on the sidewalls of the trench of the BEVA 132. In some embodiments, the lining layer 161 is a seed layer of the material electroplated thereon. For example, if the material composing the BEVA includes copper, the lining layer 161 can be a seed layer of the electroplated copper. In some other embodiments, the lining layer 161 may include TaN or Ta.

In some embodiments, the BEVA 132 of the MRAM structure 100_1A is electrically coupled to a doped region of the transistor structures 101, in which the doped region is a drain region 105 or a source region 103. In other embodiments, the BEVA 132 of the MRAM structure 100_1A is electrically coupled with the gate region 107 of the transistor structures 101.

The bottom electrode 131 is arranged over the BEVA 132. In some embodiments, the bottom electrode 131 may include conductive materials such as TiN, TaN, Ti, Ta or Ru. The MTJ 135 is disposed over the bottom electrode 131. In some embodiments, the MTJ 135 includes a stack of layers (not separately shown), such as a free layer, a tunnel layer, and a pinned layer disposed over one another. The top electrode 158 is disposed over the MTJ 135. In some embodiments, the top electrode 158 may include conductive materials such as TiN, TaN, Ti, Ta or Ru. In some embodiments, the top electrode 158 and the bottom electrode 131 are made of a same material. In some embodiments, the material of the top electrode 158 is different from that of the BEVA 132. In some embodiments, the top electrode 158 includes a multilayer structure.

As shown in FIG. 1A, sidewalls of the bottom electrode 131, the MTJ 135 and the top electrode 158 are laterally surrounded by a protection layer or a spacer 127. The protection layer 127 has a top surface level same as the top surface level of the top electrode 158. In some embodiments, the protection layer 127 includes silicon nitride (SiN).

In some embodiments, a dielectric layer 129 is disposed over and laterally surrounding the protection layer 127. The dielectric layer 129 may have a top surface level with the top surface of the top electrode 158 and the top surface of the protection layer 127. The dielectric layer 129 may include silicon oxide, silicon nitride, silicon oxynitride, or other suitable materials.

Figure 1B:
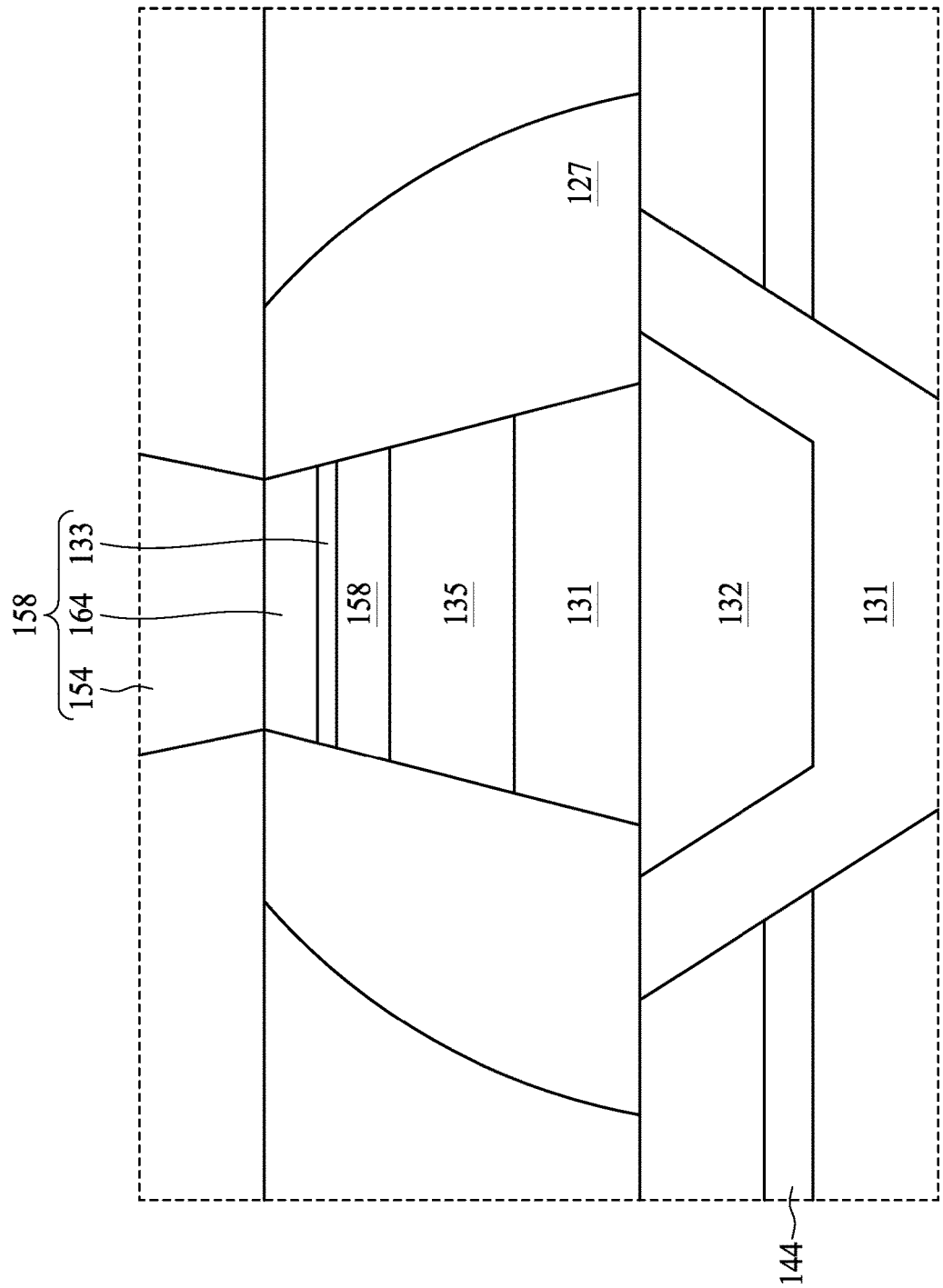
FIG. 1B is a zoomed-in perspective view of an MRAM structure of the semiconductor structure in FIG. 1A, in accordance with some embodiments of the present disclosure.

FIG. 1B is a zoomed-in perspective view of a portion 12 in FIG. 1A around the MRAM structure 100_1A of the semiconductor structure 10, in accordance with some embodiments of the present disclosure. The top electrode 158 includes a lower portion 133 and an upper portion 154 over and separated from the lower portion 133. The lower portion 133 and the upper portion 154 may have the same conductive materials. In some embodiments, each of the lower portion 133 and the upper portion 154 has a height between about 50 Å and about 300 Å, or between about 10 Å and about 250 Å. In some embodiments, the top electrode 158 includes an interface region 164 between the lower portion 133 and the upper portion 154. In some embodiments, the interface region 164 is in an oxide form of the lower portion 133 and may include $TiO_2$ or other metal oxide. In some embodiments, the interface region 164 has a thickness between about 1 Å and about 5 Å.

FIG. 2 to FIG. 33 are cross-sectional views of a semiconductor structure, e.g., the semiconductor structure 10 shown in FIG. 1A, fabricated at various stages, in accordance with some embodiments of the present disclosure. It should be understood that additional stages can be provided before, during, and after the stages shown in the sequence of FIGS. 2 through 33, and some of the stages described below can be replaced or eliminated in other embodiments. The order of the stages may be interchangeable.

Figure 2:
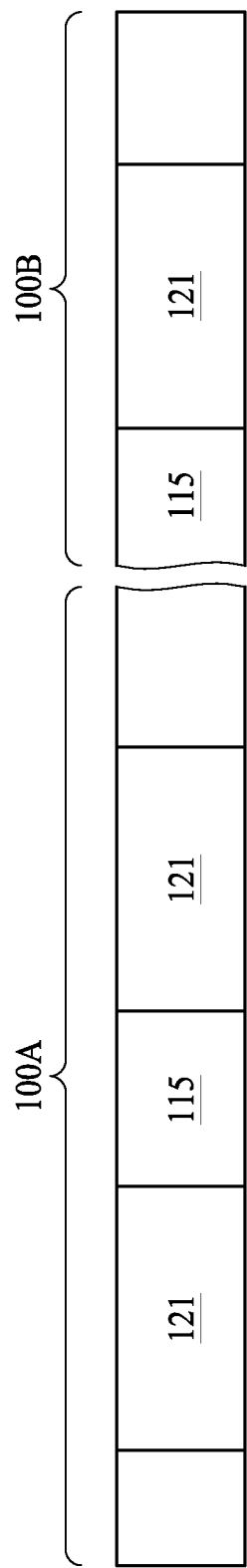
FIGS. 2, 3, 4, 5, 6, 7, 8, 9, 10A, 10B, 11, 12, 13, 14, 15, 16, 17, 18, 19, 20, 21, 22, 23, 24 and 25 are cross-sectional views of intermediate stages of manufacturing a semiconductor structure, in accordance with some embodiments of the present disclosure.

In FIG. 2, a semiconductor structure having a predetermined memory region 100A and a logic region 100B is formed or provided. In some embodiments, a transistor structure is pre-formed in a semiconductor substrate (not shown in FIG. 2). The integrated circuit device including the transistor structures 101 shown in FIG. 1A may undergo further CMOS or MOS technology processing to form various features known in the art.

FIG. 2 also illustrates the formation of at least part of the metallization structure 102 shown in FIG. 1A. An Nth metal line 121 is patterned in an IMD layer 115 over the transistor structure. The metal line 121 is a conductive line and comprises conductive materials, such as copper, tungsten, aluminum, gold, silver, alloys thereof and the like. In some embodiments, the Nth metal line 121 can be formed of an electroplating operation with a seed layer deposited over the patterned IMD layer 115. In other embodiments, the Nth metal line 121 may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the Nth metal line 121 and the top surface of the IMD layer 115.

Figure 3:
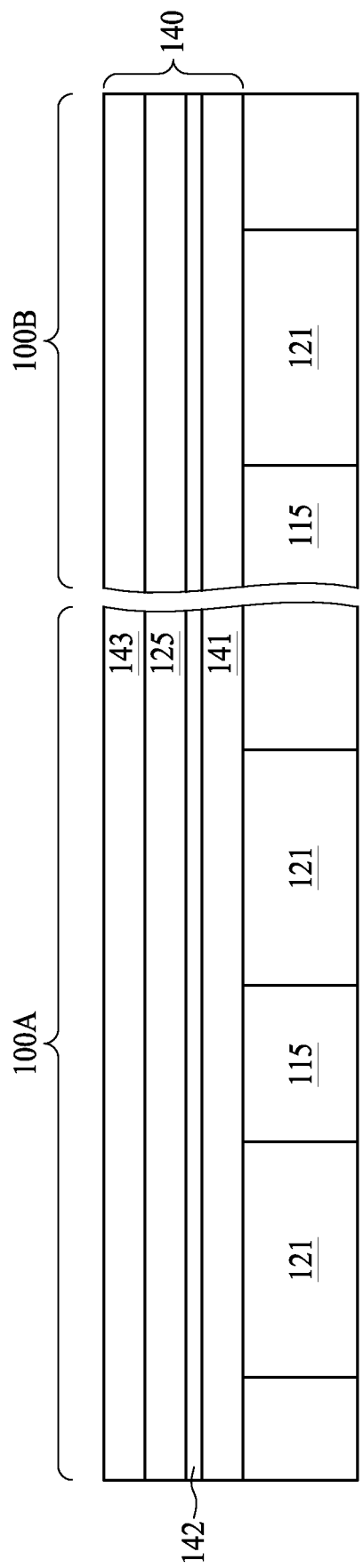

In FIG. 3, a layer stack 140 formed of dielectric layers 141, 142 and 143 and the IMD layer 125 are blanket deposited over a top surface of the Nth metal line 121 and a top surface of the IMD layer 125 of the Nth metal line layer, in both the memory region 100A and the logic region 100B. In some embodiments, the barrier layers 141 through 143 are formed of SiC, aluminum oxide and SiC, respectively, and the IMD layer 125 is formed of TEOS (tetraethyl orthosilicate). The layer stack 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 4:
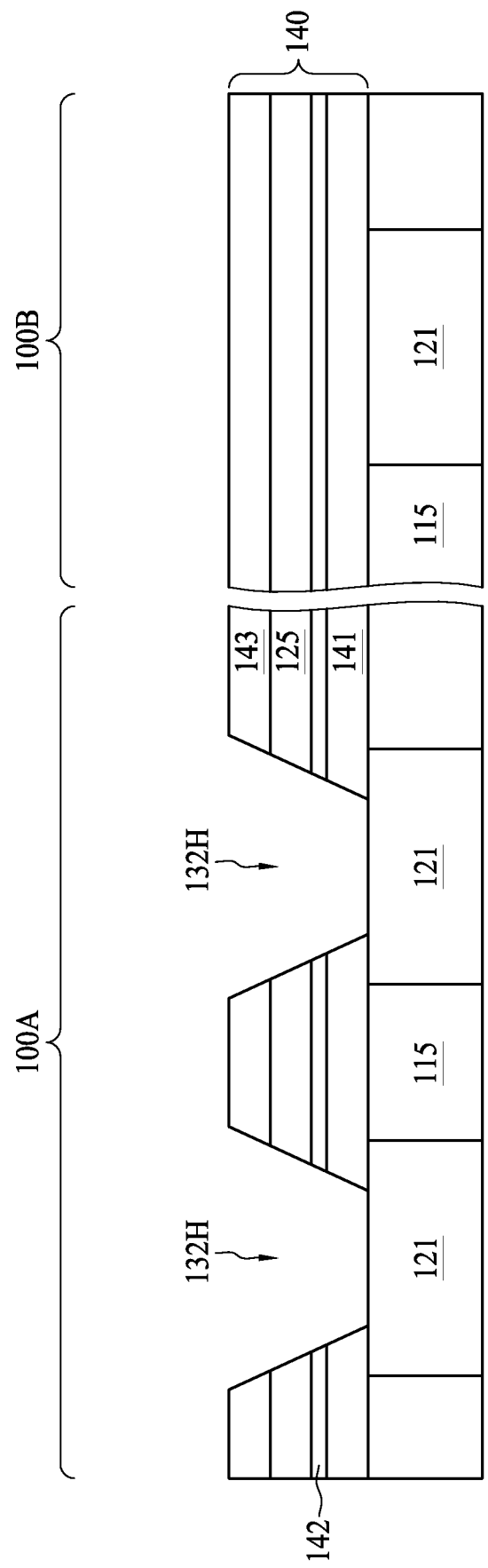

In FIG. 4, a photoresist layer (not shown) is patterned over the layer stack 140 to expose one or more BEVA holes 132H of the MRAM structure 100_1A. As shown in FIG. 4, two BEVA holes 132H are formed in the layer stack 140 by a suitable dry etch operation. In some embodiments, the dry etch in the present operation includes reactive ion etch (RIE) adopting fluorine-containing gases. Referring to the logic region 100B, the layer stack 140 is protected by the photoresist layer (not shown) such that a top surface of the Nth metal line 121 is not exposed in contrast to the layer stack 140 in the memory region 100A.

Figure 5:
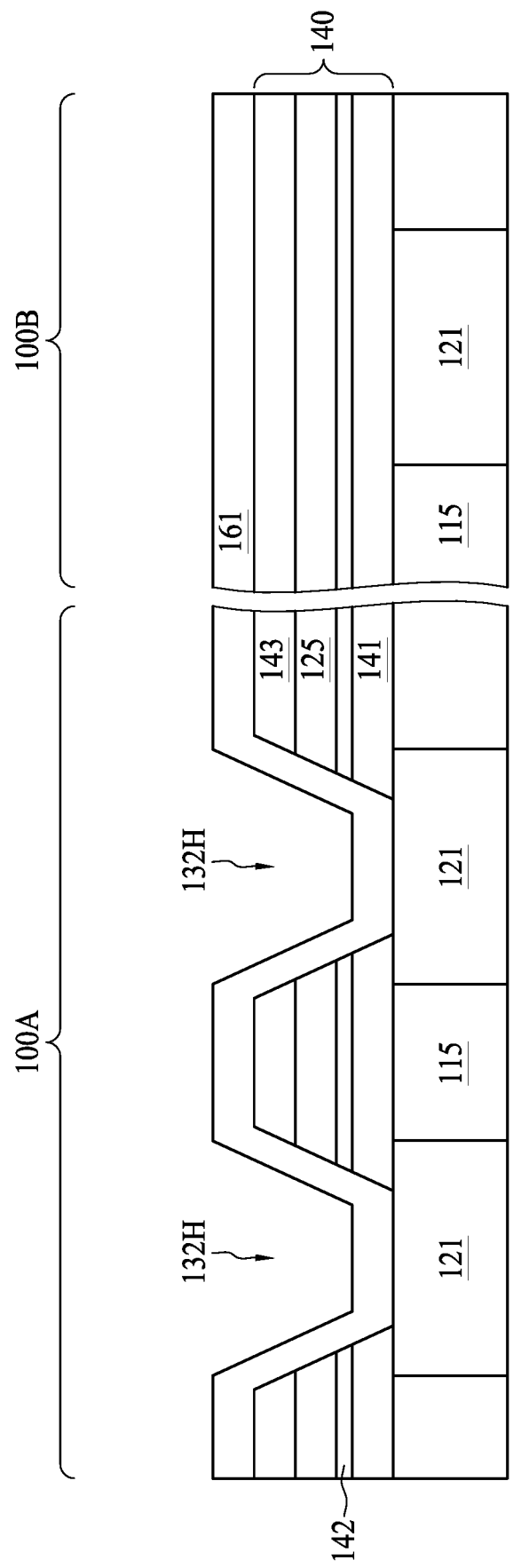
Figure 6:
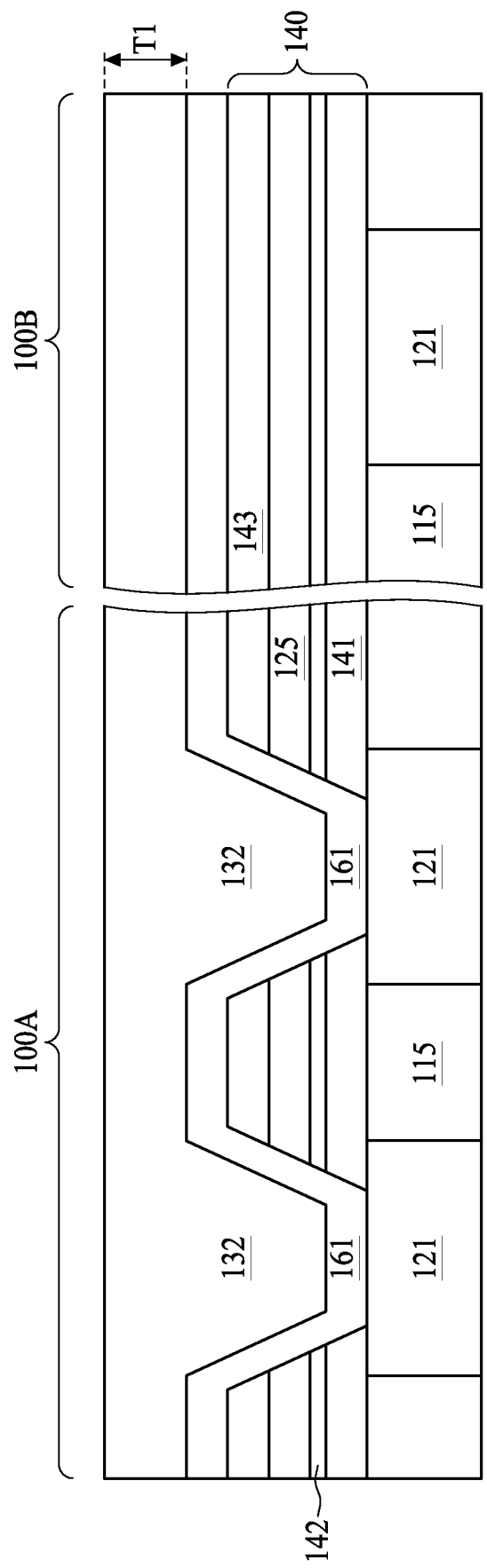

In FIG. 5, a lining layer 161 is blanket-formed over the BEVA holes 132H in the memory region 100A and over the layer stack 140 in the logic region 100B. Subsequently, as shown in FIG. 6, deposition of BEVA 132 is conducted to be disposed over the lining layer 161 and the layer stack 140. The BEVA 132 may be composed of conductive materials such as metal. In some embodiments, the BEVA 132 can be electroplated copper. The lining layer 161 and the BEVA 132 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, a overfilling of the BEVA 132 is carried out in the electroplating operation with a thickness T1 over the horizontal surface of the lining layer 161. The overfill may be required to effectively minimize the dimple which may occur over the BEVA holes 132H after the electroplating operation.

Figure 7:
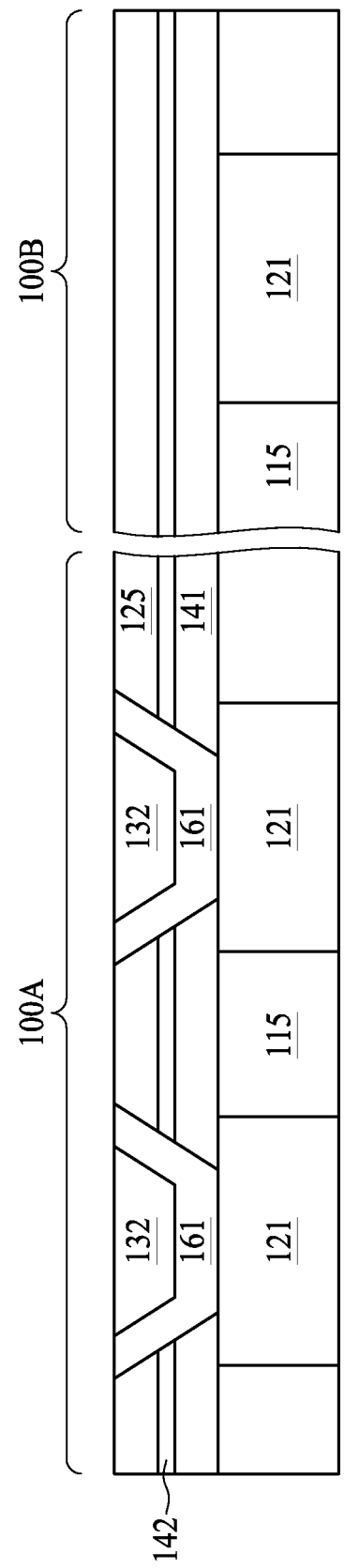

In FIG. 7, the lining layer 161 and the deposited BEVA 132 are then etched back to level with a top surface of the IMD layer 125. A multi-step chemical mechanical polishing (CMP) may be carried out to form a flat top surface of the BEVA 132 and the lining layer 161. In some embodiments, the multi-step CMP is adopted with slurries of different selectivity to achieve the flat top surface. Initially, a first selective removal includes utilizing a first slurry having a higher selectivity to copper than to the lining layer 161. In some embodiments, the first slurry includes $H_2O_2$, benzotriazole (BTA), carboxylic acid, and abrasives. The first slurry consumes copper faster than the lining layer 161, rendering a dishing over the copper filling of the BEVA 132. Subsequently, a second selective removal includes utilizing a second slurry having a higher selectivity to the lining layer 161 than to copper. In some embodiments, the second slurry includes $H_2O_2$, benzotriazole (BTA), pH adjustor, carboxylic acid, and abrasives. The second slurry consumes the lining layer 161 faster than copper, rendering a removal of the lining layer 161 without consuming much of the exposed copper. A third selective removal includes utilizing a third slurry having a higher selectivity to the lining layer 161 than to copper. In some embodiments, the third slurry includes $H_2O_2$, inhibitor, pH adjustor, carboxylic acid, and abrasives. The third slurry consumes one of the dielectric stacks faster than copper, for example, rendering a removal of the barrier layer 141 without consuming much of the exposed copper.

Figure 8:
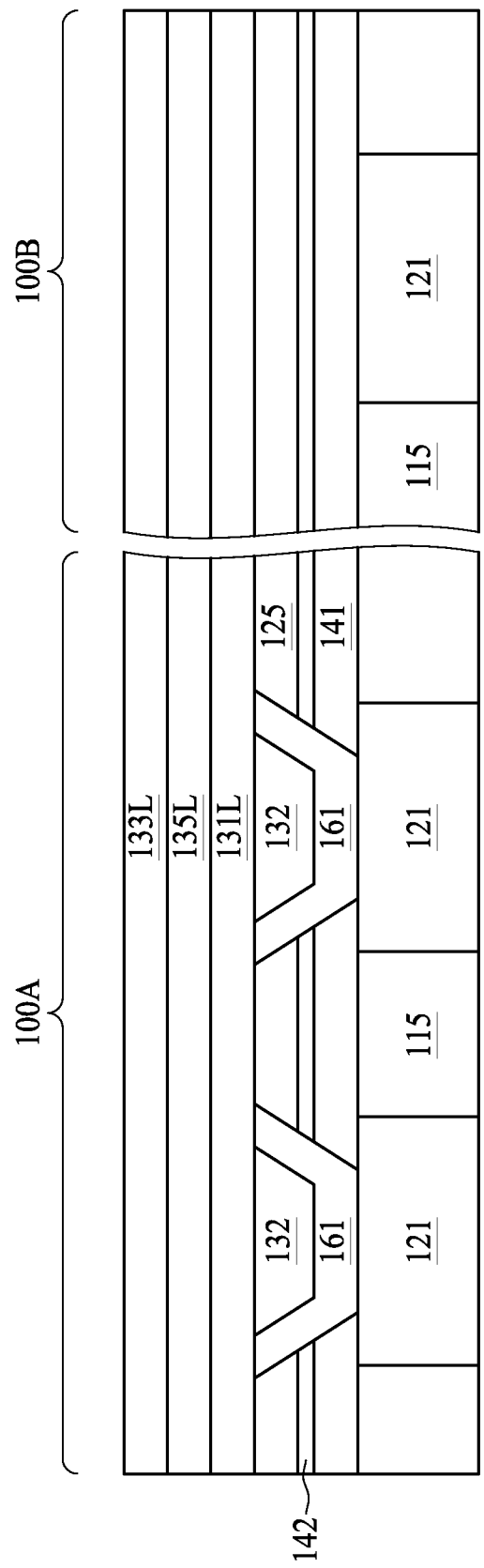

In FIG. 8, a bottom electrode layer 131L is deposited on the planarized BEVA 132 and the lining layer 161. The bottom electrode layer 131L may include TiN, TaN, Ta or Ru. In some embodiments, the bottom electrode layer 131L has a thickness in a range from about 50 Å to about 500 Å. The deposited bottom electrode layer 131L may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, a planarization operation, such as CMP, is performed to level the top surface of the bottom electrode layer 131L.

Then, an MTJ layer 135L is deposited in a form of multiple material stacks (not illustrated in FIG. 8) over the bottom electrode layer 131L. In some embodiments, the MTJ layer 135L has a thickness in a range from about 50 Å to about 500 Å or between 100 Å to about 350 Å. In some embodiments, the top surface of the MTJ layer 135L has a roughness between about 2 Å and about 10 Å. In some embodiments, the MTJ layer 135L may include ferromagnetic layers, spacers, and a capping layer. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. The capping layer is formed on the ferromagnetic layer and may reduce write current of its associated MRAM cell. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacers may include non-ferromagnetic metal, for example, Ag, Au, Cu, Ta, W, Mn, Pt, Pd, V, Cr, Nb, Mo, Tc, Ru or the like. Another material for the spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. It is contemplated that the MTJ layer 135L may include an antiferromagnetic layer in accordance with other embodiments.

The MTJ layer 135L may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

A first top electrode layer 133L is deposited over the MTJ layer 135L. In some embodiments, the first top electrode layer 133L is a conductive layer and includes a conductive material, such as TiN, TaN, Ti, Ta or Ru. In some embodiments, the first top electrode layer 133L has a thickness from about 50 Å to about 1000 Å. The first top electrode layer 133L may be formed by a variety of techniques, e.g., high-density ionized metal plasma (IMP) deposition, high-density inductively coupled plasma (ICP) deposition, sputtering, physical vapor deposition (PVD), DC or RF PVD, pulsed DC sputtering, chemical vapor deposition (CVD), low-pressure chemical vapor deposition (LPCVD), plasma-enhanced chemical vapor deposition (PECVD), atomic layer deposition (ALD) and the like.

In some embodiments, the first top electrode layer 133L is deposited at a chamber processing pressure between about 10 mTorr and about 400 mTorr and a chamber backside pressure between 0.1 mTorr and 10 mTorr. In some embodiments, the first top electrode layer 133L is deposited at a temperature between about 200° C. and about 450° C. In some embodiments, the deposition of first top electrode layer 133L is performed with a DC power between about 1 kW and about 30 kW and an AC power between about 0 W to about 1000 W. The applied voltage may be between about 500 volts and about 900 volts and the applied current may be between about 5 A and about 35 A. The AC frequency may be equal to or greater than 13.56 MHz, such as 2 GHz. The magnet disposed in the process chamber may be disposed at a distance to the deposited target between 38 mm and about 46 mm and configured to operate at a spin rate between about 50 rpm and about 70 rpm. A gas mixture of $N_2$ and argon is introduced during the deposition of the first top electrode layer 133L with a gas flow rate between about 0 sccm and about 1500 sccm.

Figure 9:
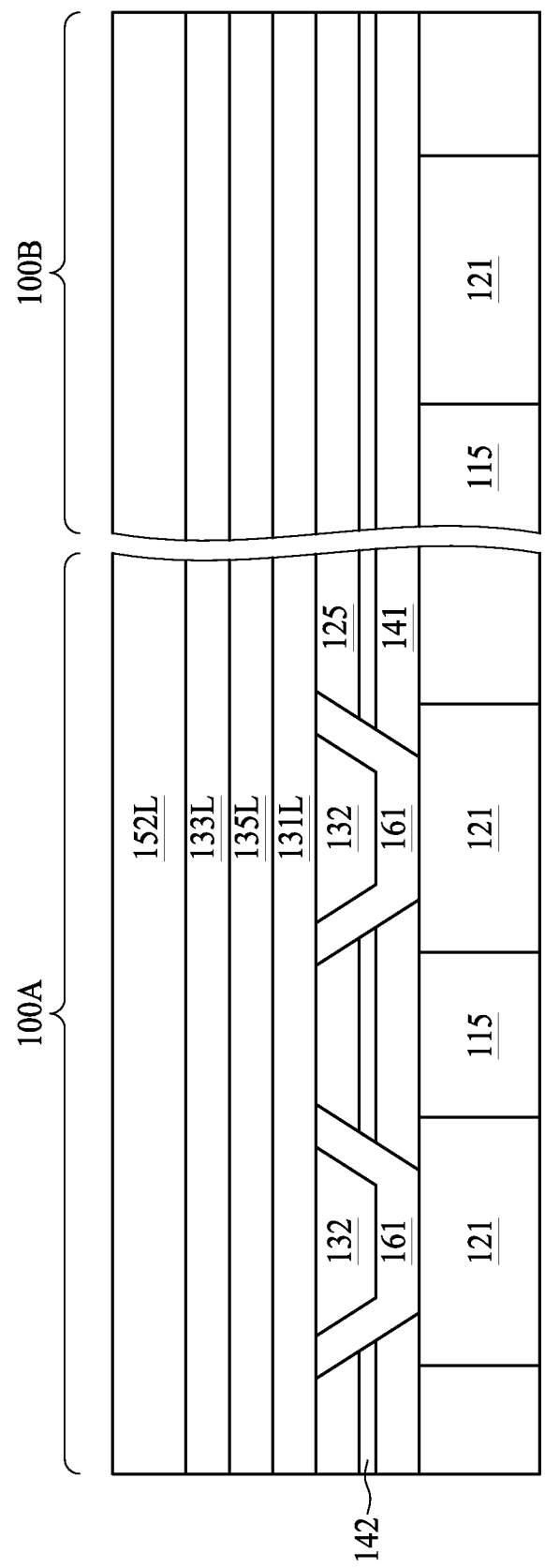

Referring to FIG. 9, a sacrificial layer 152L is formed over the first top electrode layer 133L. The sacrificial layer 152L may be patterned to serve as a mask layer or an etch buffer structure for subsequent etching operation. In some embodiments, the sacrificial layer 152L is formed of a dielectric material, such as oxide, nitride, oxynitride, or other suitable dielectric materials. In some embodiments, the sacrificial layer 152L includes TEOS or nitrogen-free anti-reflection layer (NR-ARL). In some embodiments, the sacrificial layer 152L is doped with silicon or carbon for enhancing film stress. In some other embodiments, the sacrificial layer 152L includes a conductive material, such as TiN, TaN, W, or other suitable conductive materials different from the first top electrode layer 133L. In some embodiments, the sacrificial layer 152L has a thickness from about 50 Å to about 1000 Å. In some embodiments, the sacrificial layer 152L has a thickness from about 100 Å to about 800 Å or between about 200 Å to about 500 Å.

The sacrificial layer 152L may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), atomic layer deposition (ALD) and the like.

Figure 10A:
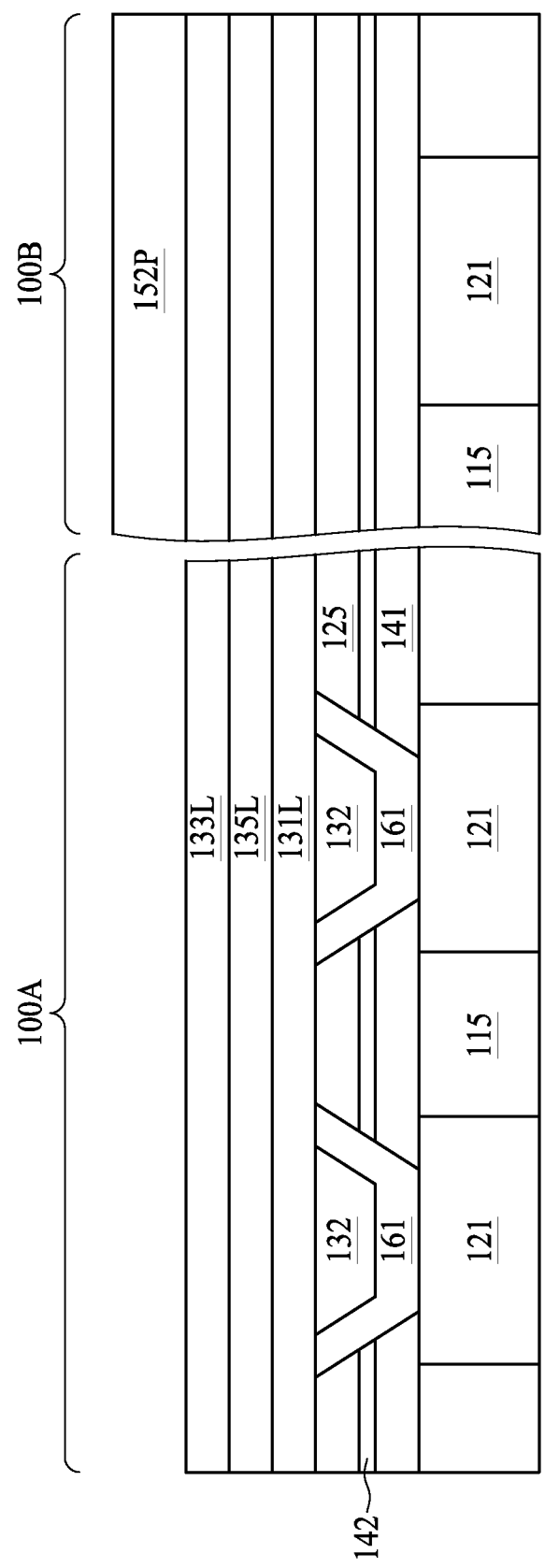

In FIG. 10A, the sacrificial layer 152L is patterned into a patterned sacrificial layer 152P such that portions of the first top electrode layer 133L in the memory region 100A are exposed. The portions of the first top electrode layer 133L in the logic region 100B remain covered by the patterned sacrificial layer 152P. In some embodiments, the patterning operation is performed by a photolithographic operation on the sacrificial layer 152L, followed by an etching operation to remove the undesired portions of the sacrificial layer 152L.

In some embodiments, the etching operation is a wet etch, a dry etch, or a combination thereof, such as reactive ion etch (RIE). In embodiments where the etching operation is a dry etch, a fluorine-based etching gas may be utilized to aid in selective etching of the sacrificial layer 152L. In some embodiments, the portions of the sacrificial layer 152L in the logic region 100B is kept substantially intact or consumed in a relatively slow rate, such that the underlying first top electrode layer 133L remains covered by the patterned sacrificial layer 152P. In some embodiments, the patterned sacrificial layer 152P in the logic region 100B serves as an etch buffer structure, which may aid in protecting the underlying metal lines or metal vias in the metallization layers in the logic region 100B from being damaged during subsequent etching operations. In some embodiments, a thickness of the first top electrode layer 133L in the memory region 100A is etched through the patterning operation such that the first top electrode layer 133L is thinned but is not completely removed.

In some embodiments, the operations subsequent to the step of FIG. 10A are performed without breaking vacuum. Therefore, the surface of the first top electrode layer 133L can be kept off oxygen in the ambient air and oxidation of the surface of the first top electrode layer 133L can be prevented. In some embodiments, the operations subsequent to the step of FIG. 10A are performed in a different chamber from that used for the etching operation shown in FIG. 10A.

Figure 10B:
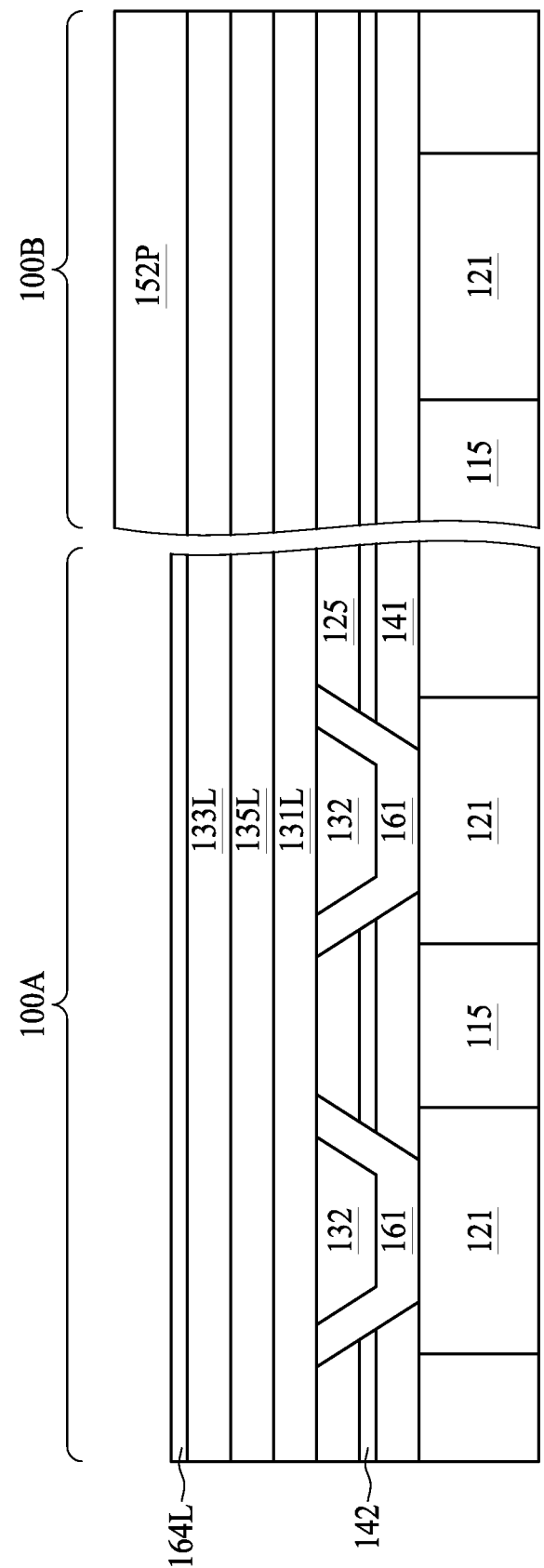

As a result, it is likely that the first top electrode layer 133L is exposed to oxygen and an interface layer 164L is grown on the upper surface of the first top electrode layer 133L as shown in FIG. 10B. The interface layer 164L may be an oxide of the conductive material of the first top electrode layer 133L. The embodiments with reference to FIGS. 11 to 25 are shown in a sequence directly following the step of FIG. 10A, in which the first top electrode layer 133L is formed free of any interface layer thereon. However, persons having ordinary skill in the art can understand that the procedures with reference to FIGS. 11 to 25 can be modified such that the interface layer 164L is grown on the surface of the first top electrode layer 133L. As a result, the finalized top electrode 158 includes an interface region 164 between the lower portion 133 and the upper portion 154 of the top electrode 158, as illustrated in FIG. 1B.

Figure 11:
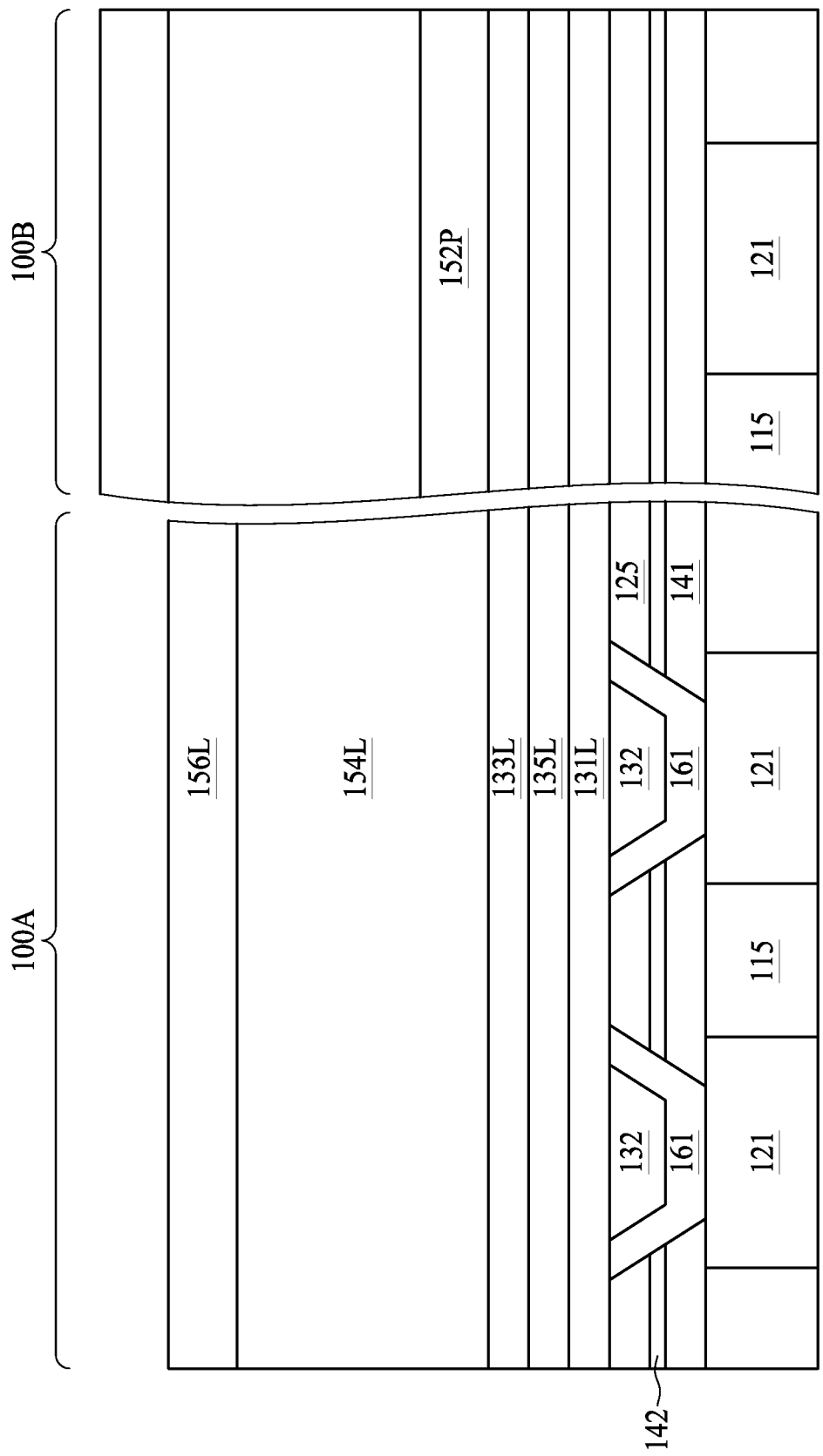

Referring to FIG. 11, a second top electrode layer 154L is deposited over the first top electrode layer 133L and the patterned sacrificial layer 152P. In some embodiments, the second top electrode layer 154L is a conductive layer and includes conductive materials, such as TiN, TaN, Ti, Ta or Ru. The second top electrode layer 154L may have the same material as the first top electrode layer 133L. In some embodiments, the second top electrode layer 154L has a thickness from about 50 Å to about 1500 Å. In some embodiments, the second top electrode layer 154L has a thickness from about 100 Å to about 1200 Å.

In some embodiments, the mask layer 156L is formed over the second top electrode 154L. The mask layer 156L is used for patterning the underlying top electrode layers 154L and 133L, the MTJ layer 135L and the bottom electrode layer 131L to thereby form one or more MRAM structures 100_1A shown in FIG. 1A. The mask layer 156L may include TEOS or silicon oxide. Alternatively, the mask layer 156L may have a multi-layer structure, which may include, for example, an oxide layer, an advanced patterning film (APF) layer and an oxide layer. In some embodiments, the mask layer 156L has a thickness in a range between about 50 Å and about 500 Å.

Each of the second top electrode layer 154L, the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 12:
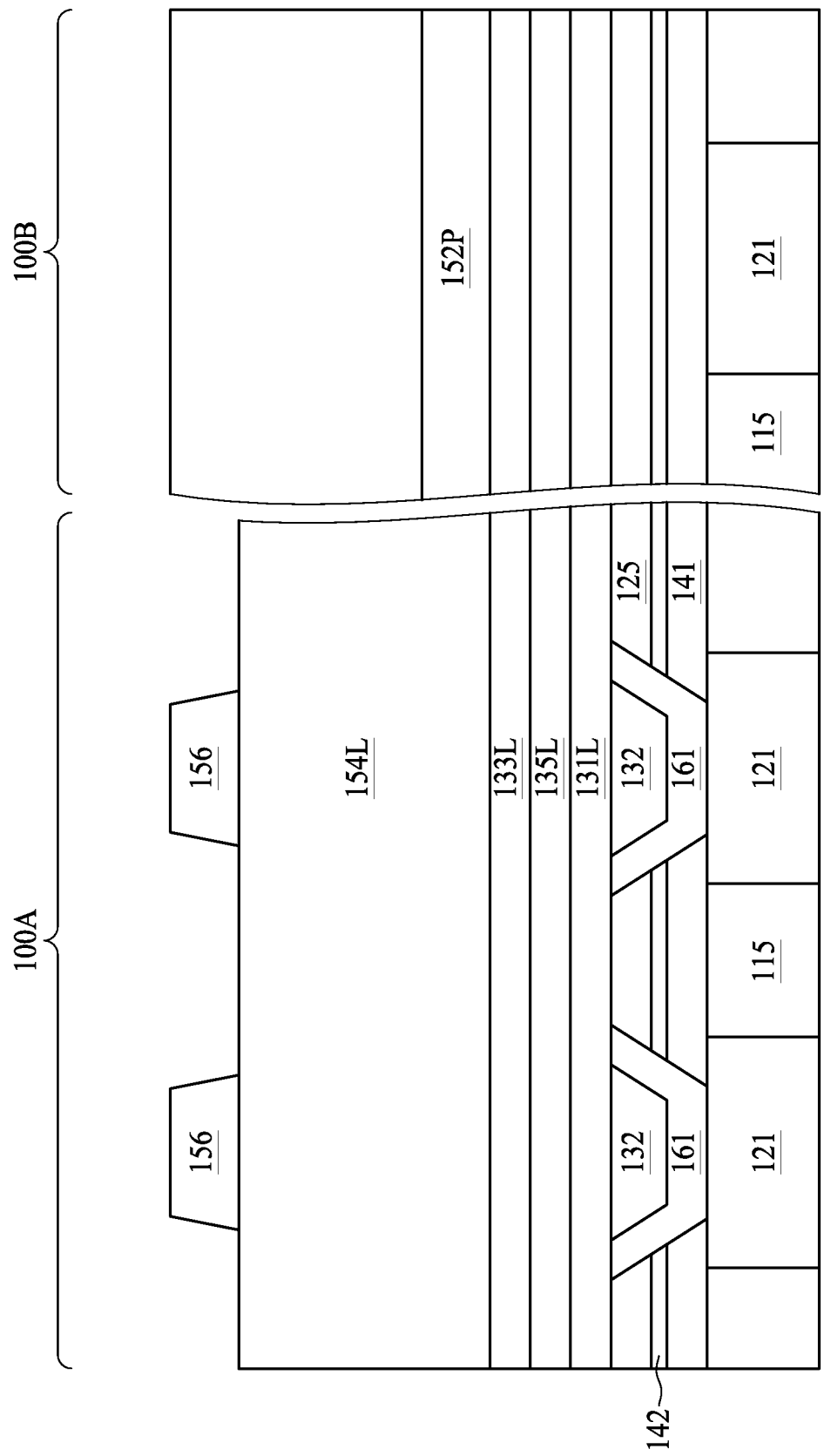

In FIG. 12, the mask layer 156L is patterned to form a patterned mask layer 156, which corresponds to a pattern of top electrodes 158 of the MRAM structures 100_1A from a top-view perspective in the memory region 100A. The portions of the mask layer 156L in the logic region 100B are removed through the patterning operation in FIG. 12. In some embodiments, the patterning operation may involve photolithographic and etching operations. The etching operation may be a wet etch, a dry etch, or a combination thereof, such as RIE.

Figure 13:
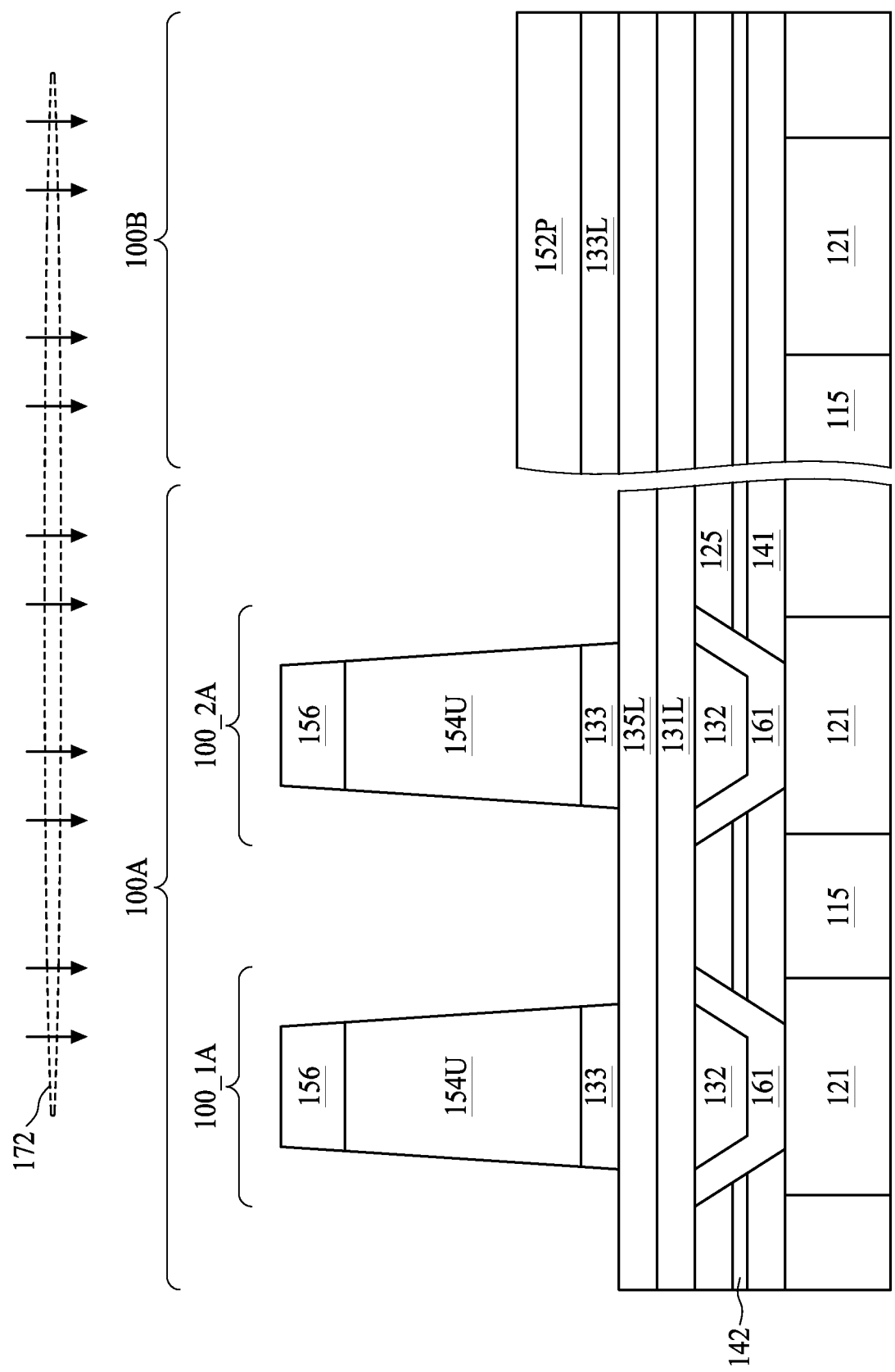

Referring to FIG. 13, the second top electrode layer 154L and the first top electrode layer 133L are patterned using the patterned mask layer 156 as an etching mask. The pattern of the patterned mask layer 156 is transferred to the underlying second top electrode layer 154L and the first top electrode layer 133L. One or more second top electrode portions 154U and lower portions 133 of the top electrodes 158 for the respective MRAM structure 100_1A or 100_2A are formed accordingly. Through the patterning operation, the materials of the second top electrode layer 154L and the first top electrode layer 133L in the logic region 100B are removed. The MTJ layer 135L and the patterned sacrificial layer 152P are exposed in the memory region 100A and the logic region 100B, respectively, during the patterning operation.

In some embodiments, the patterning operation may be performed by a selective etching operation 172, such as a wet etch, a dry etch, or a combination thereof, such as RIE. In embodiments where a dry etch is performed, a fluorine-based etchant is used for facilitating the selective etching operation 172 such that the etch proceeds through the second top electrode layer 154L and the first top electrode layer 133L and stops at the patterned sacrificial layer 152P or the MTJ layer 135L. In some embodiments, the MTJ layer 135L is kept substantially intact during the selective etching operation 172. In some embodiments, a relatively thin portion of the patterned sacrificial layer 152P is consumed through the selective etching operation 172.

Figure 14:
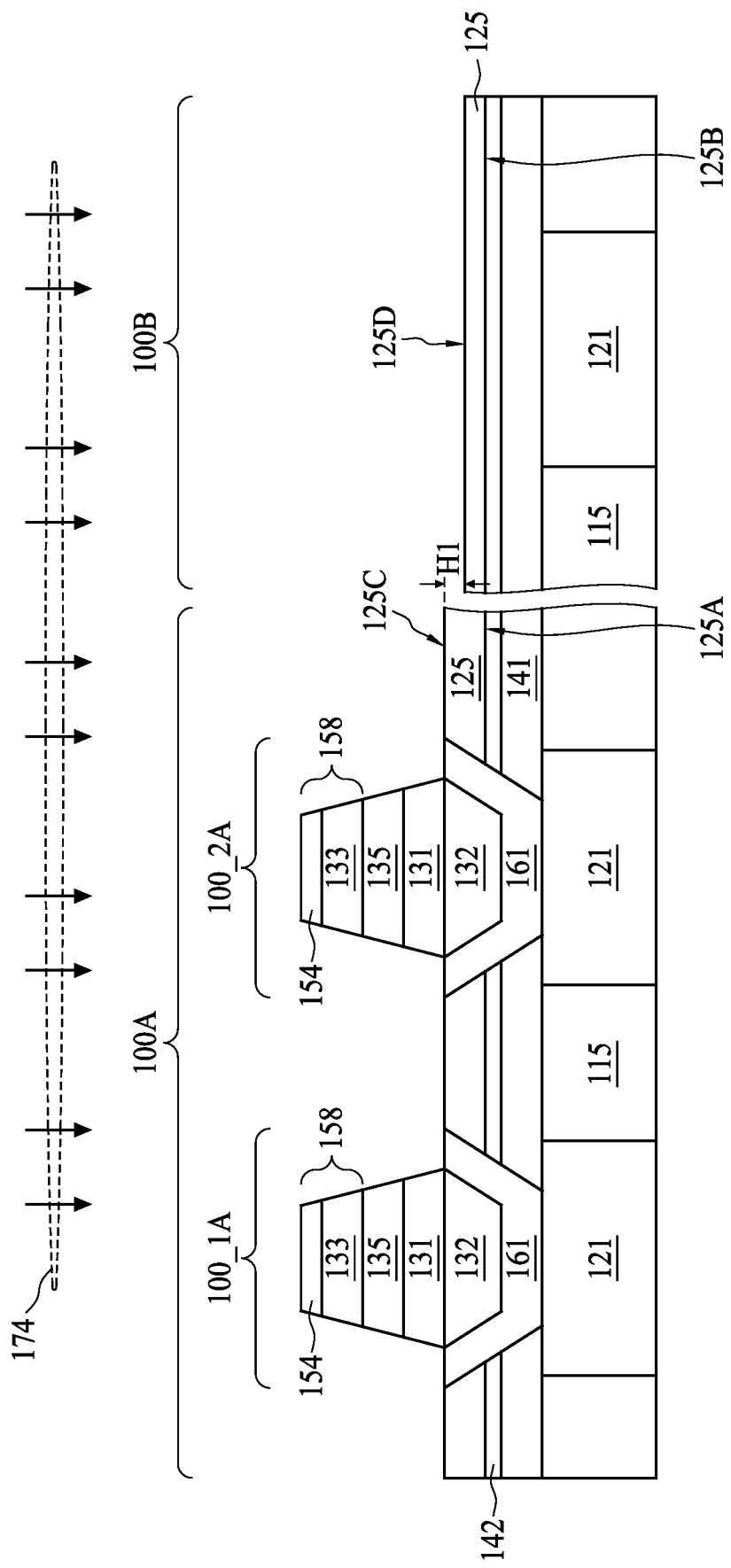

FIG. 14 illustrates an etching operation 174, which completely removes the patterned mask layer 156 and partially removes the second top electrode portions 154U to leave the upper portions 154 of the top electrodes 158. Throughout the present disclosure, the lower portion 133 and the upper portion 154 are referred to the lower portion and the upper portion, respectively, of the top electrode 158 of the respective MRAM structure 100_1A or 100_2A. In some embodiments, the etching operation 174 performed in FIG. 14 is a non-selective etching operation, such as an ion bombardment etch (IBE), which removes the entire patterned mask layer 156 and upper portions of the second top electrode layer 154L.

During the etching operation 174, while the patterned mask layer 156 and the second top electrode layer 154L are being consumed, the remained materials of the patterned mask layer 156 and the second top electrode portions 154U serve as etch masks of the etching operation 174 in etching the MTJ layer 135L and the bottom electrode layer 131L to thereby form a patterned MTJ 135 and a patterned bottom electrode 131 of the respective MRAM structure 100_1A or 100_2A. In some embodiments, the sidewalls of the lower and upper portions 133 and 154, the MTJ 135 and the bottom electrode 131 have a trapezoidal shape viewing from a cross section. In some embodiments, the MRAM structures 100_1A and 100_2A have different widths viewing from a cross section.

In some embodiments, the etching operation 174 stops at the IMD layer 125 at the tier of the BEVA 132 in the memory region 100A. At the same time, the etching operation 174 consumes the remaining patterned sacrificial layer 152P, the first top electrode layer 133L, the MTJ layer 135L and the bottom electrode layer 131L in the logic region 100B and exposes the IMD layer 125 at the tier of the BEVA 132. In some embodiments, the etching operation 174 proceeds further downwardly and removes a thickness of the IMD layer 125 such that the remaining thickness of the IMD layer 125 in the logic region 100B is less than that in the memory region 100A. A height difference H1 is formed between the surfaces of the IMD layer 125 in the memory region 100A and the logic region 100B. In some embodiments, the height H1 is between about 50 Å and about 1000 Å. In some embodiments, the IMD layer 125 has a first lower surface 125A in the memory region 100A having the same level with a second lower surface 125B in the logic region 100B and a first upper surface 125C in the memory region 100A higher than a second upper surface 125D in the logic region 100B by the height difference H1. In some embodiments, the etch removes the entire IMD layer 125 and exposes the barrier layer 142 or 141. In some embodiments, the metal line 121 of the Nth metal line layer in the logic region 100B remains covered by at least one or more of the barrier layers 141 and 142.

Existing patterning operations for forming the MRAM structures 100_1A and 100_2A using the non-selective etching operation may simultaneously remove the materials of the top electrode layers 133L and 154L, the MTJ layer 135L, and the bottom electrode layer 131L in the logic region 100B. However, since the logic region 100B occupies most of the die area, e.g. about 95% of the die area compared to about 5% occupied by the memory region 100A, the plasma may be in a greater density in the logic region 100B than the memory region 100A, causing an over etch in the logic region 100B and exposure/damage of the Nth metal line 121 in the Nth metal line layer of the logic region 100B. The conductive material removed from the Nth metal line 121 by the etching operation may also become a source of contamination. As such, the proposed etch buffer structure, which includes the sacrificial layer 152P and the first top electrode layer 133L in the logic region 100B, may aid in increasing the etch margin for the etching operation 174 during the patterning of the MRAM structures 100_1A and 100_2A. The device defects due to the over etch can be thus be eliminated or reduced in the logic region 100B.

Figure 15:
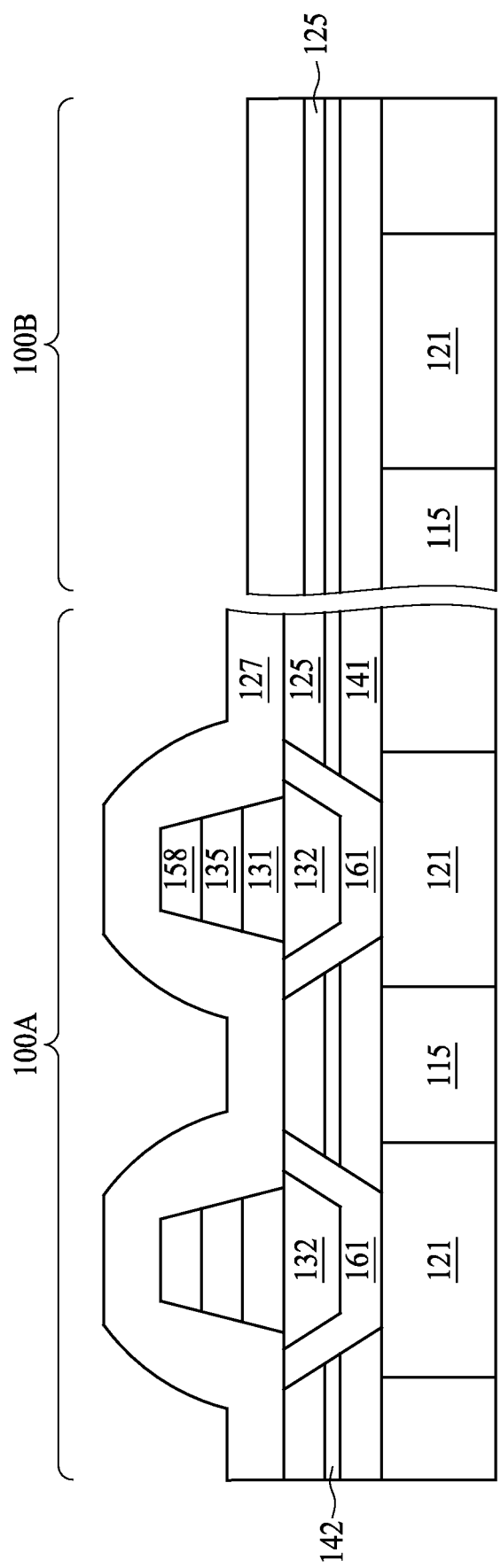
Figure 16:
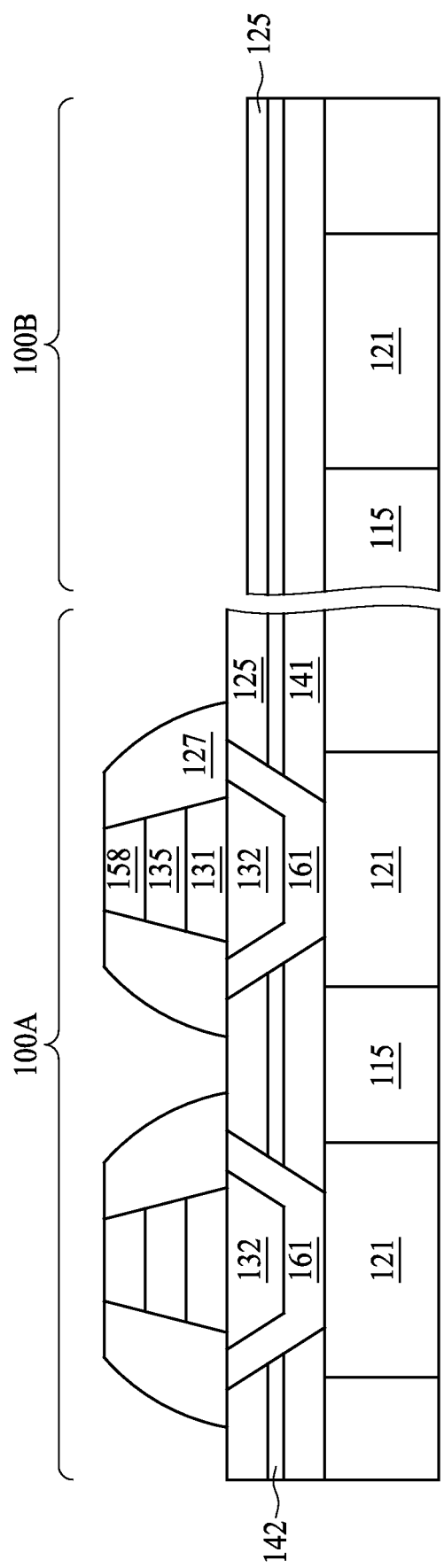

FIG. 15 shows a deposition of the protection layer 127 over the bottom electrode 131, the MTJ 135 and the top electrode 158. In some embodiments, the protection layer 127 possesses a thickness of from about 50 Å to about 300 Å. Note a sidewall of the MTJ 135 and the sidewall of the top electrode 158 are surrounded by the protection layer 127 to prevent oxidation or other contamination. Then, as shown in FIG. 16, the protection layer 127 is patterned to expose a top surface of the IMD layer 125.

Figure 17:
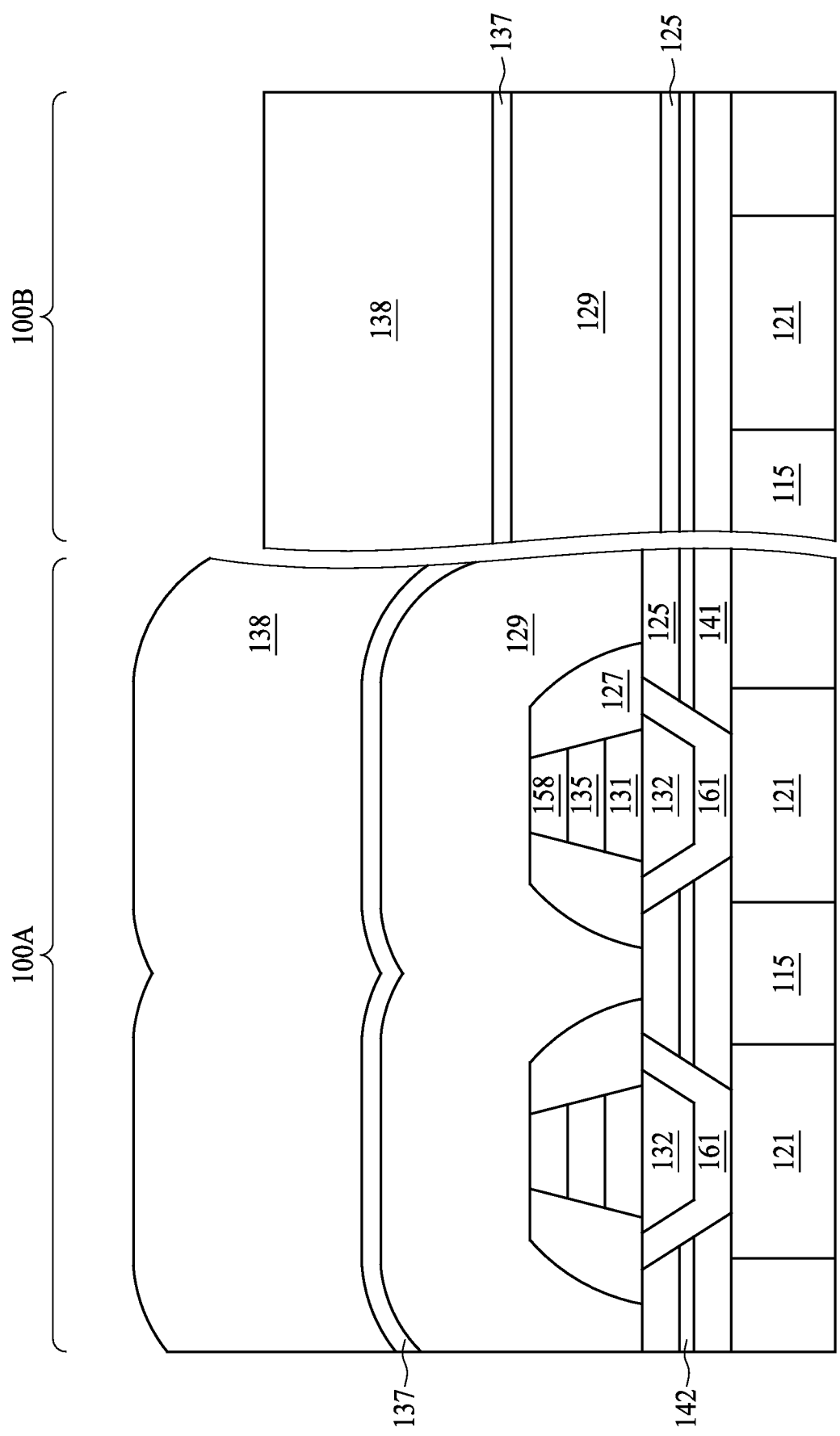

In FIG. 17, a dielectric layer 129 is conformally deposited over the protection layer 127 and the IMD layer 125 across the memory region 100A and the logic region 100B. In some embodiments, the dielectric layer 129 is composed of TEOS. In some embodiments, the dielectric layer 129 is composed of high density plasma-oxide (HDP-oxide). However, this is not a limitation of the present disclosure. A stop layer 137 is formed over the dielectric layer 129. In some embodiments, the stop layer 137 is a silicon nitride (SiN) stop layer. Another dielectric layer 138 is conformally formed over the stop layer 137. In some embodiments, the dielectric layer 138 has a material different from the dielectric layer 125 and may be a USG layer.

Figure 18:
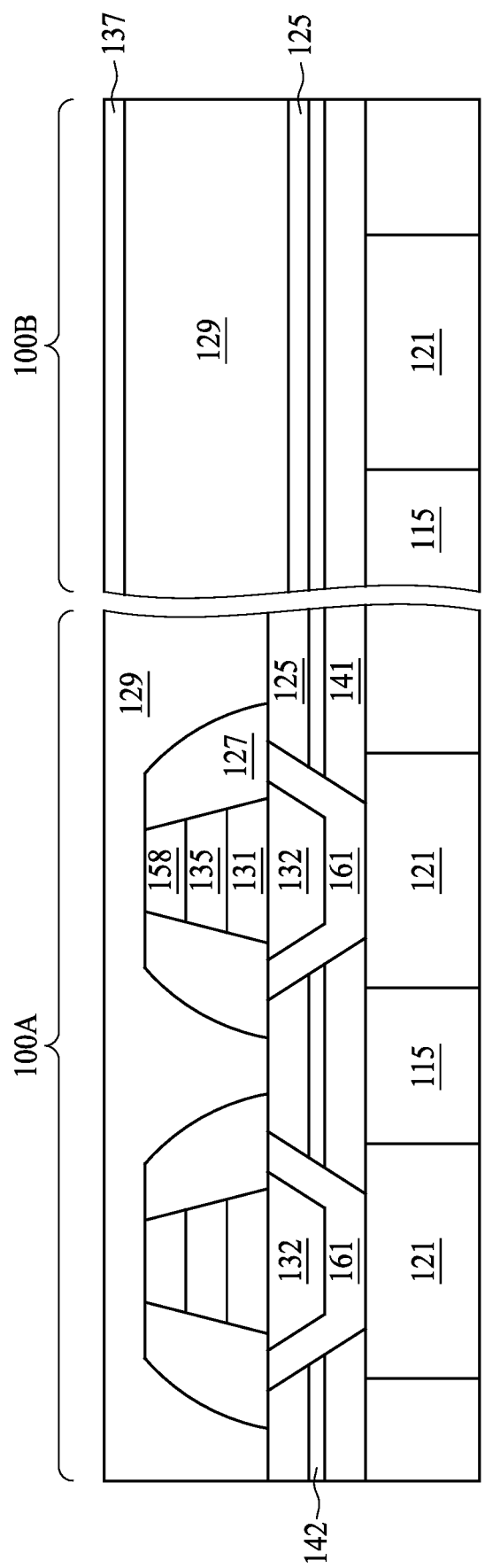

A planarization operation, such as CMP, is carried out to remove the dielectric layer 138. Since the logic region 100B occupies most of the die area, a depth of the CMP operation is strongly correlated to an indication of the stop layer 137 in the logic region 100B. As shown in FIG. 18, the CMP operation stops at the level of the stop layer 137 above the logic region 100B, and the dielectric layer 138 and a portion of the dielectric layer 129 over the memory region 100A are removed.

Figure 19:
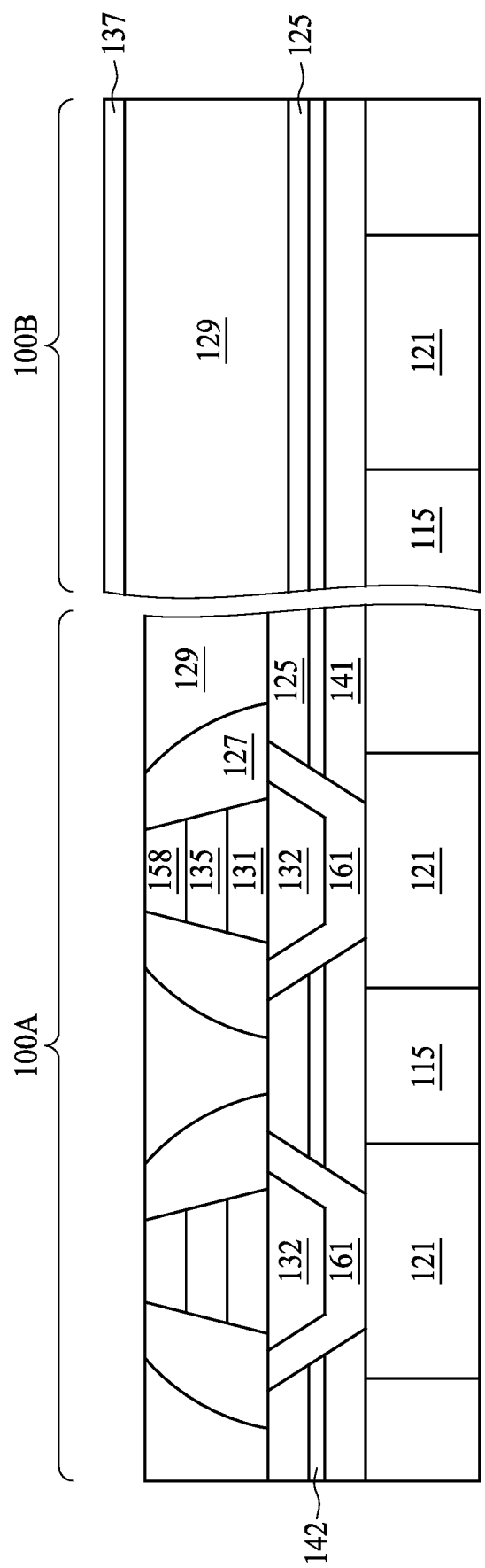

Through the CMP operation mentioned above, the surface of the dielectric layer 129 is made relatively smooth and is helpful to ensure the exposure of the top electrode 158 of each MRAM structure 100_1A in the memory region 100A in the following thinning operation. In FIG. 19, a thinning operation such as an etching process is performed on the smoothed dielectric layer 129 over the memory region 100A such that the top surface of the dielectric layer 129 is substantially flat across the memory region 100A. As shown in FIG. 19, the top surface of the top electrode 158 is exposed from the dielectric layer 129 after the thinning operation.

Figure 20:
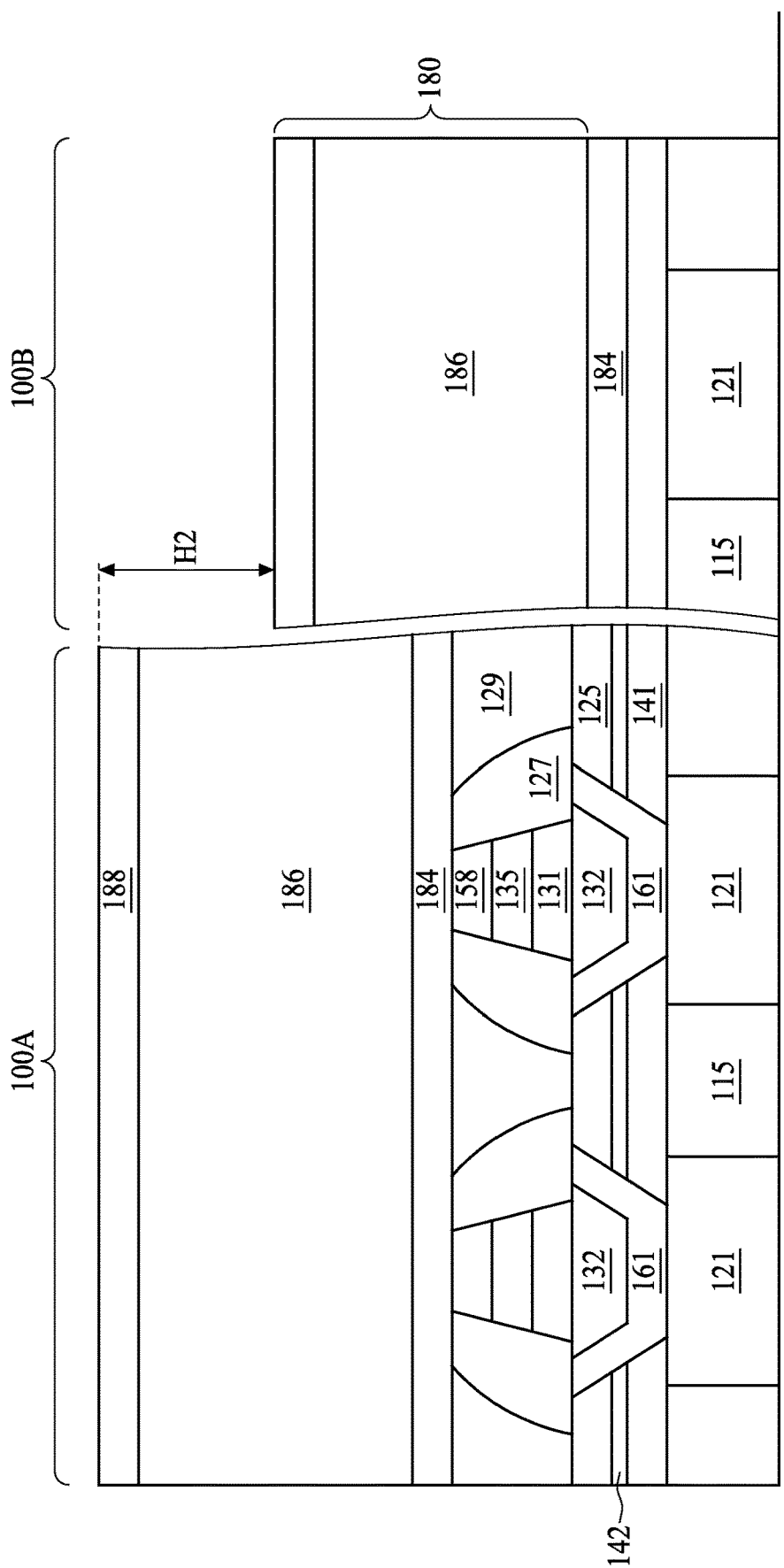
Figure 21:
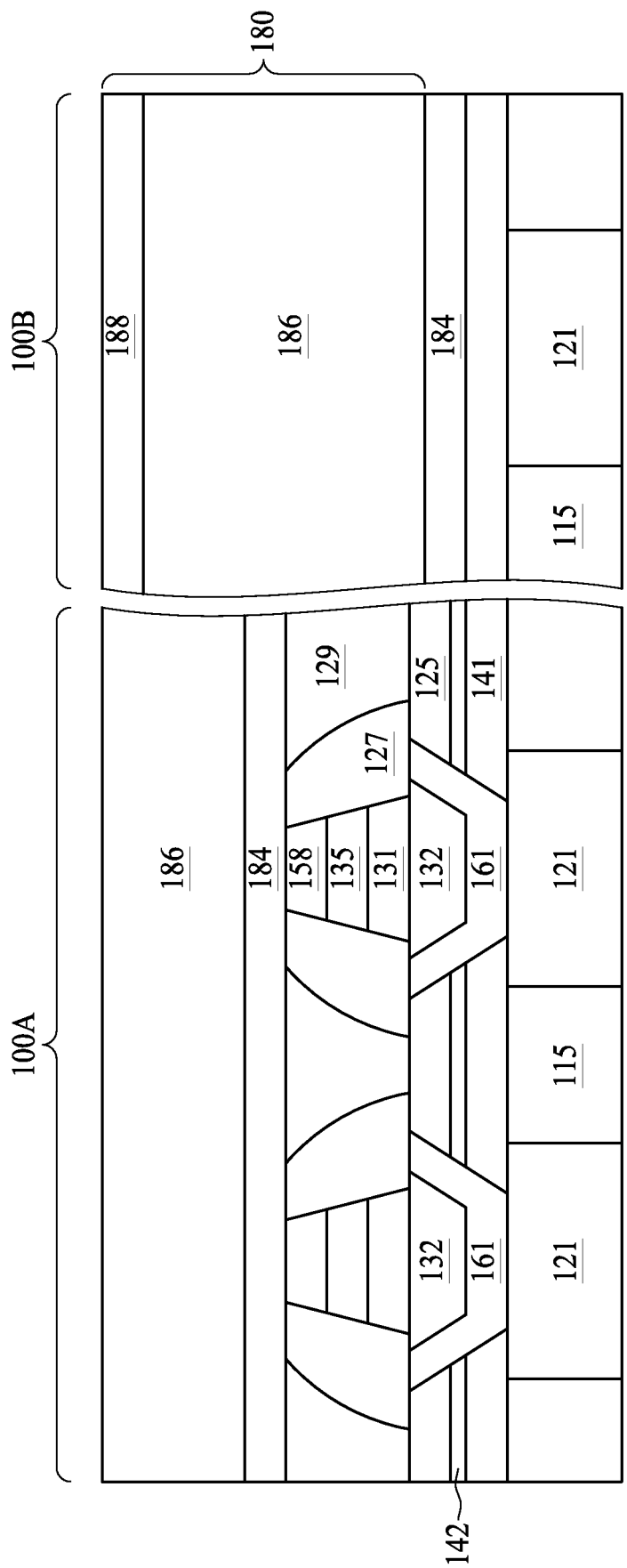

In FIG. 20, the dielectric layer 129 are removed from the logic region 100B by an etch back operation. In some embodiments, the IMD layer 125 and the barrier layer 142 are also removed, leaving the barrier layer 141 over the Nth metal line 121. Hence, the memory region 100A is in greater height than the logic region 100B. A stack 180, e.g., comprising a dielectric layer 184, an IMD layer 186 and a dielectric layer 188, is formed to conformally cover the memory region 100A and the logic region 100B. A height difference H2 can be observed in FIG. 20, therefore, an etch back operation as illustrated in FIG. 21 is performed to obtain a substantially flat top surface for the following trench formation in both the memory region 100A and the logic region 100B. Note the dielectric layer 188 of the stack 180 is remained in the logic region 100B after the planarization operation. The dielectric layer 188 is deliberately kept to act as a protection layer for the subsequent trench formation. The dielectric layer 188 can prevent the acidic solution from damaging the low k dielectric layer 186 during a photoresist stripping operation.

Figure 22:
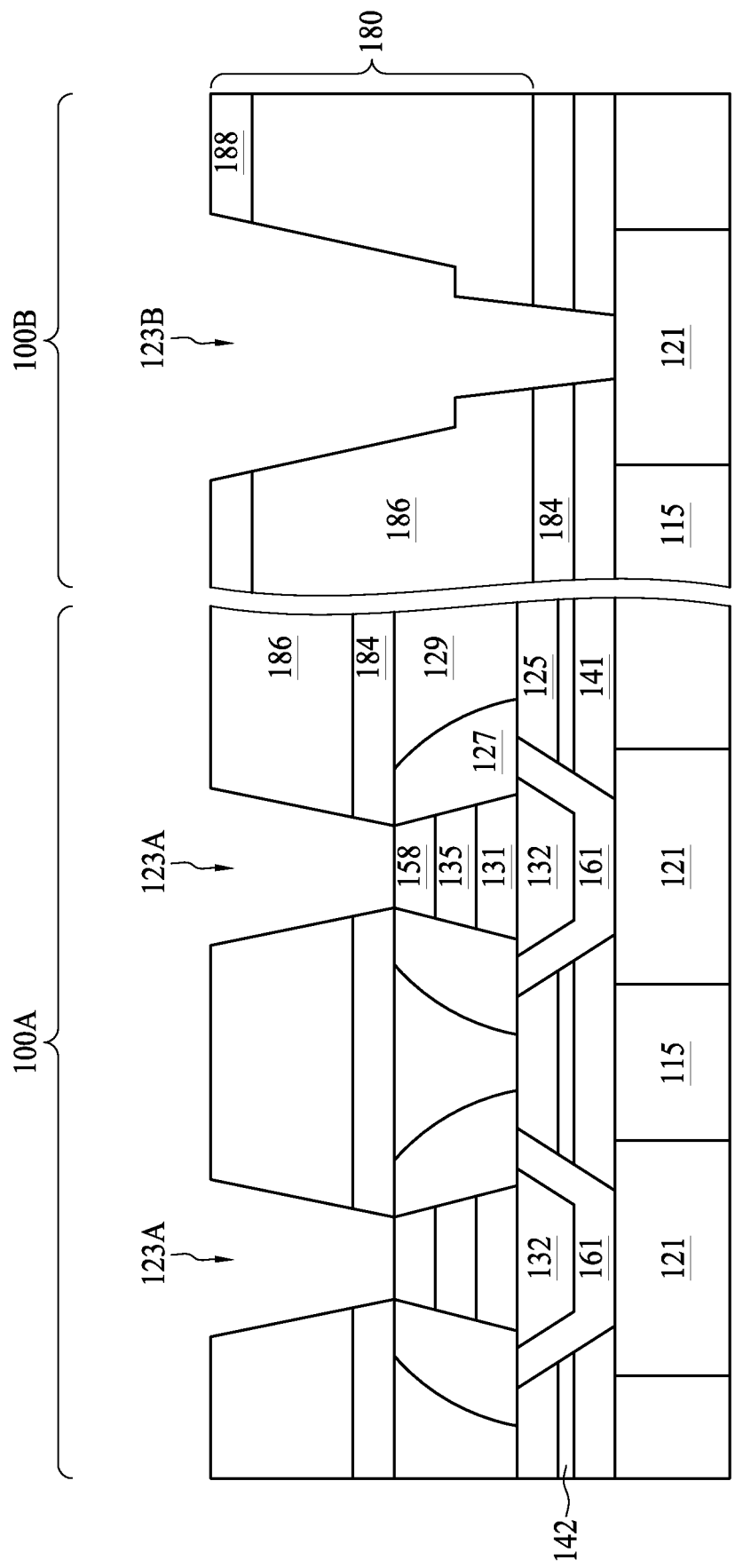

In FIG. 22, a photoresist (not shown) is patterned over the planarized dielectric surface to form trenches for metal lines and metal vias. For example, in the memory region 100A, (N+1)th metal line trenches 123A are formed over the respective MRAM structures 100_1A, exposing a top surface of the top electrode 158 of each of the MRAM structures 100_1A. In the logic region 100B, an Nth metal via trench and an (N+1)th metal line trench (collectively the trench 123B) is formed over the Nth metal line 121, exposing a top surface of the Nth metal line 121.

Figure 23:
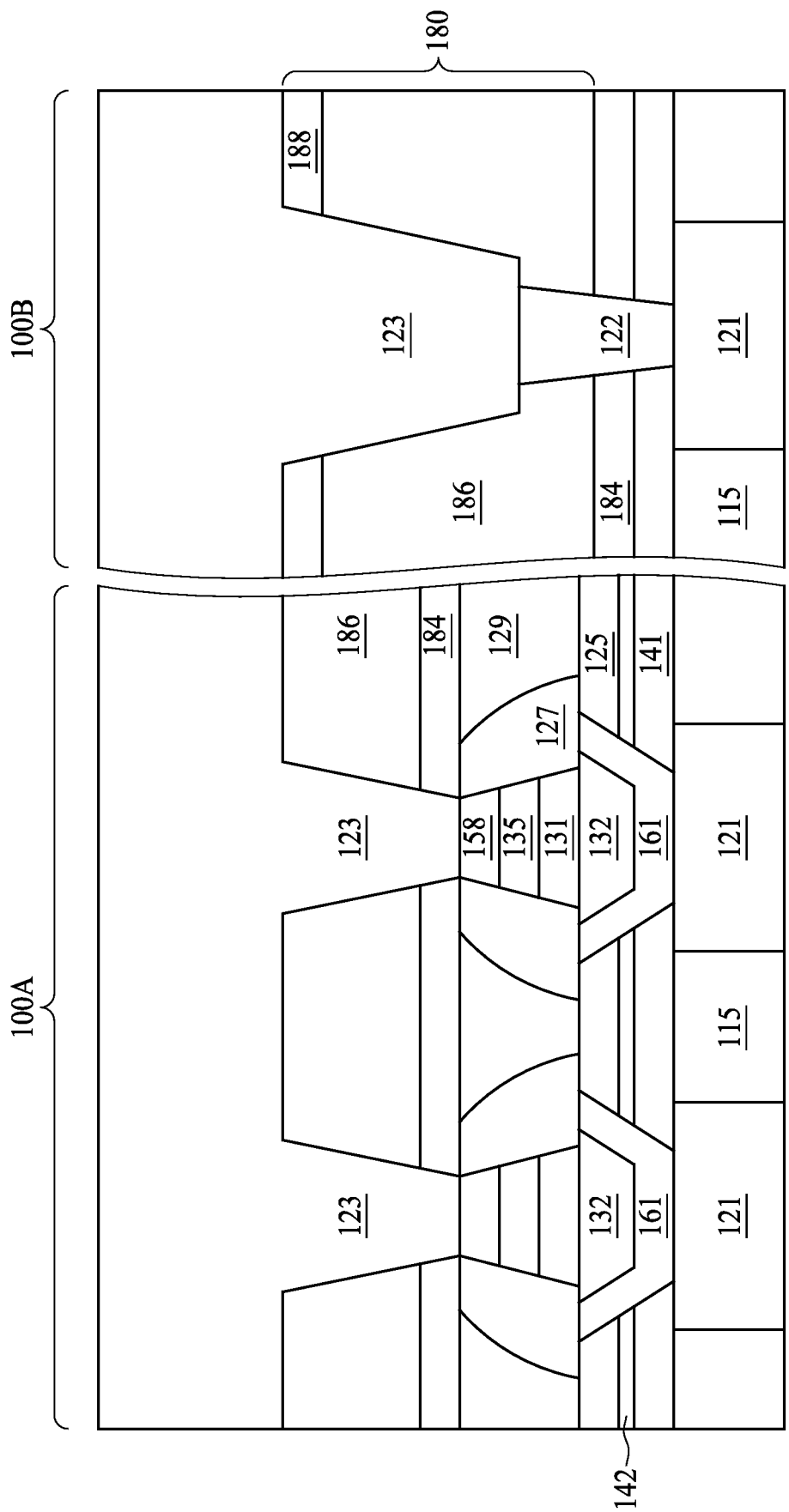
Figure 24:
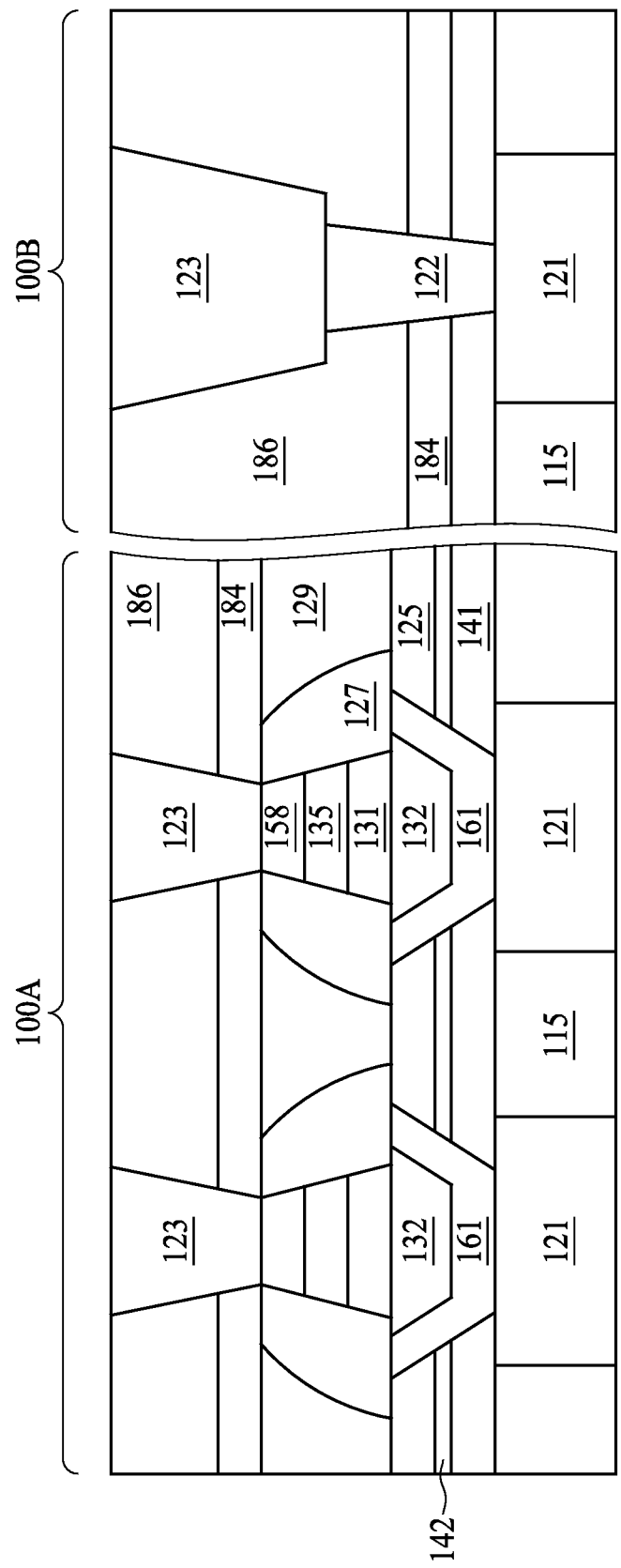

In FIG. 23 and FIG. 24, conductive metal fills the metal line trench/metal via trench (hereinafter "trenches") through, for example, a single damascene or dual damascene operation. The patterned trenches are filled with a conductive material by an electroplating operation, and excess portions of the conductive material are removed from the surface using a CMP operation, an etch operation, or combinations thereof.

In some embodiments, the (N+1)th metal line 123 may be formed from tungsten (W) or copper (Cu) and my include AlCu (collectively, Cu). In one embodiment, the (N+1)th metal lines 123 are formed using the damascene operation. In some embodiments, a seed layer of Cu is plated in the trenches 123A and 123B. Note the seed layer of Cu may be plated over a top surface of the top electrode 158. Then, a layer of copper is deposited in the trenches, followed by planarization of the copper layer, such as by CMP, down to the top surface of the IMD layer 186. The dielectric layer 188 over the trenches 123B is removed and the exposed copper surface and the upper surface of the IMD layer 186 can be coplanar. After the planarization operation removing the overburden of the conductive metal as illustrated in FIG. 24, an (N+1)th metal line 123 in both the memory region 100A and the logic region 100B, as well as an Nth metal via 122 in the logic region 100B, are formed.

Figure 25:
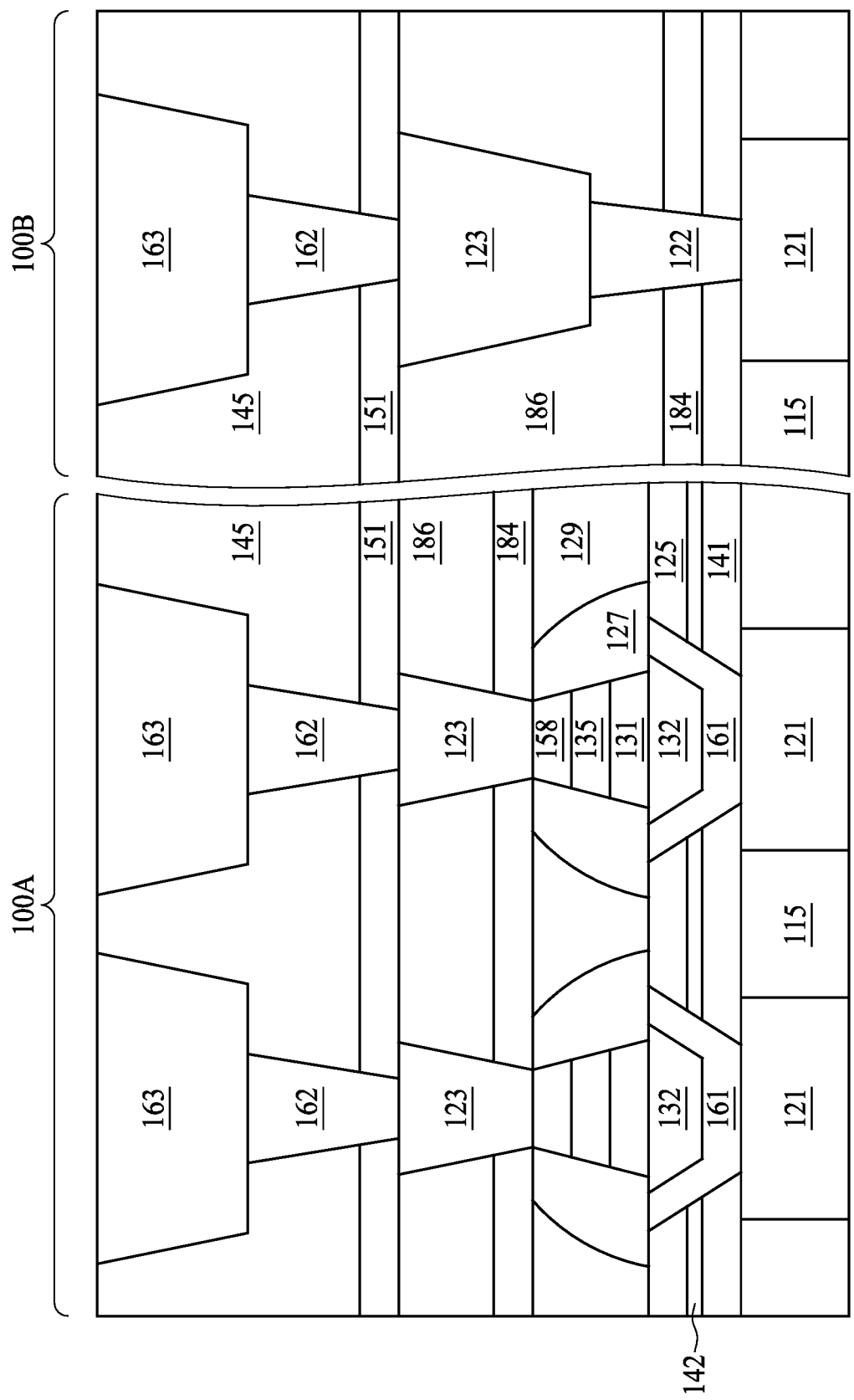

In FIG. 25, a barrier layer 151 and an IMD layer 145 are formed subsequently. An (N+1)th metal via trench as well as an (N+2)th metal line trench are formed in the IMD layer 145. Subsequent processing may further include forming various contacts/vias/lines and multilayer interconnect features (e.g., metal lines 163 and metal vias 162) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene operation is used to form a copper related multilayer interconnection structure.

FIGS. 26 to 31 are cross-sectional views of intermediate stages of manufacturing the semiconductor structure 10, in accordance with some embodiments of the present disclosure. The operations shown in FIGS. 26 to 31 are performed directly subsequent to the operation shown in FIG. 7 and replace the operations of FIGS. 8 to 14, and are followed by the operations shown in FIGS. 15 to 25. The materials, method of manufacturing and the configurations of the operations in FIGS. 26 to 31 are similar to those in FIGS. 2 to 9, 10A, 10B and 11 to 25 unless stated otherwise, and repeated descriptions are omitted for brevity.

Figure 26:
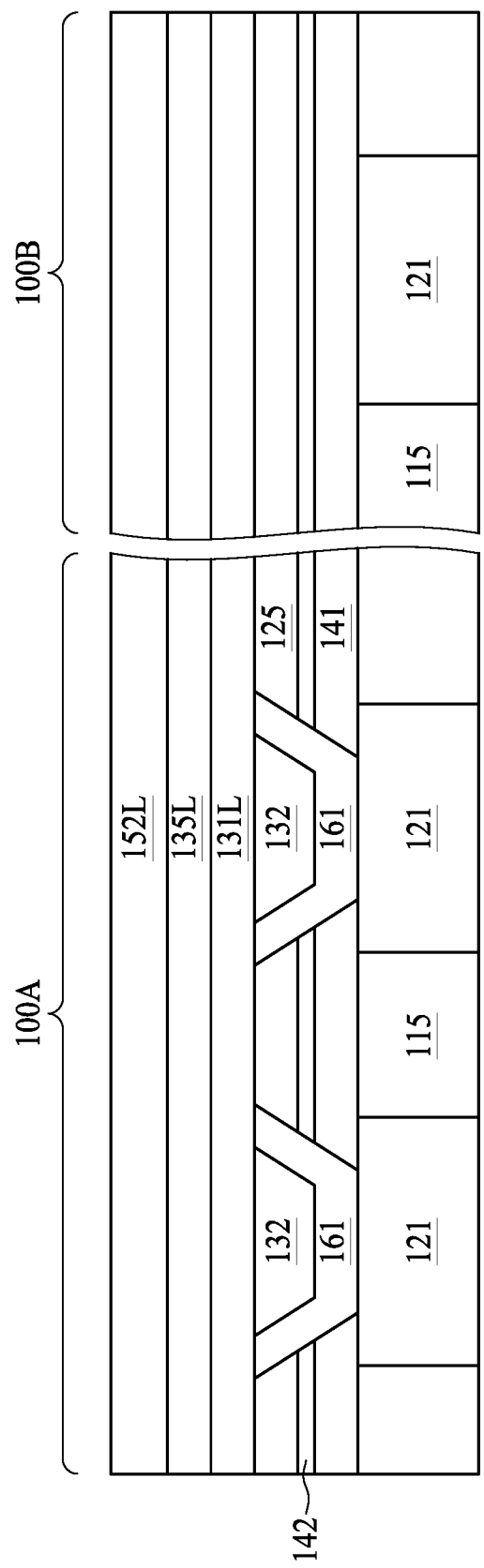
FIGS. 26, 27, 28, 29, 30 and 31 are cross-sectional views of intermediate stages of manufacturing a semiconductor structure, in accordance with some embodiments of the present disclosure.

Referring to FIG. 26, the bottom electrode layer 131L is deposited on the planarized BEVA 132 and the lining layer 161. In some embodiments, a planarization operation, such as CMP, is performed to level the top surface of the bottom electrode layer 131L. The MTJ layer 135L is deposited over the bottom electrode layer 131L. The sacrificial layer 152L is deposited directly over the MTJ layer 135L across the memory region 100A and the logic region 100B. The patterning operation shown in FIG. 26 is performed in a manner similar to that shown in FIGS. 8 and 9 except for the absence of the first top electrode layer 133L and repeated descriptions are omitted for brevity.

Figure 27:
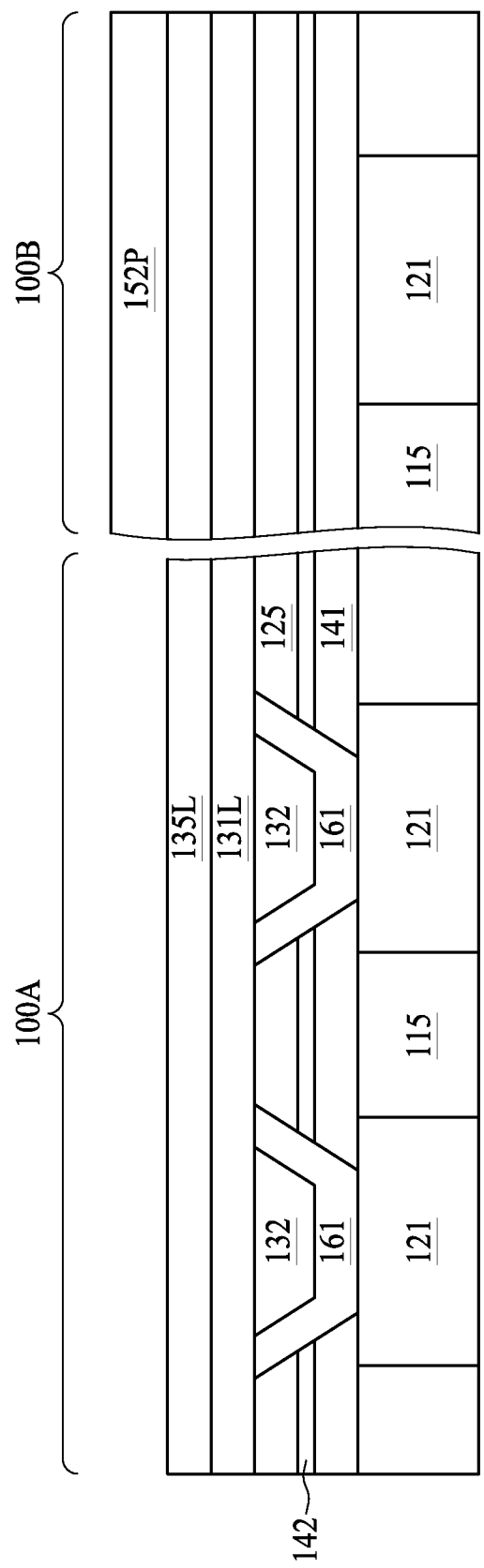

FIG. 27 illustrates a patterning operation on the sacrificial layer 152L to expose the MTJ layer 135L in the memory region 100A while keeping the MTJ layer 135L in the logic region 100B covered. In this connection, an etch buffer structure of the patterned sacrificial layer 152P is formed over the logic region 100B accordingly. The patterning operation shown in FIG. 27 is performed in a manner similar to that shown in FIG. 10, and repeated descriptions are omitted for brevity.

Figure 28:
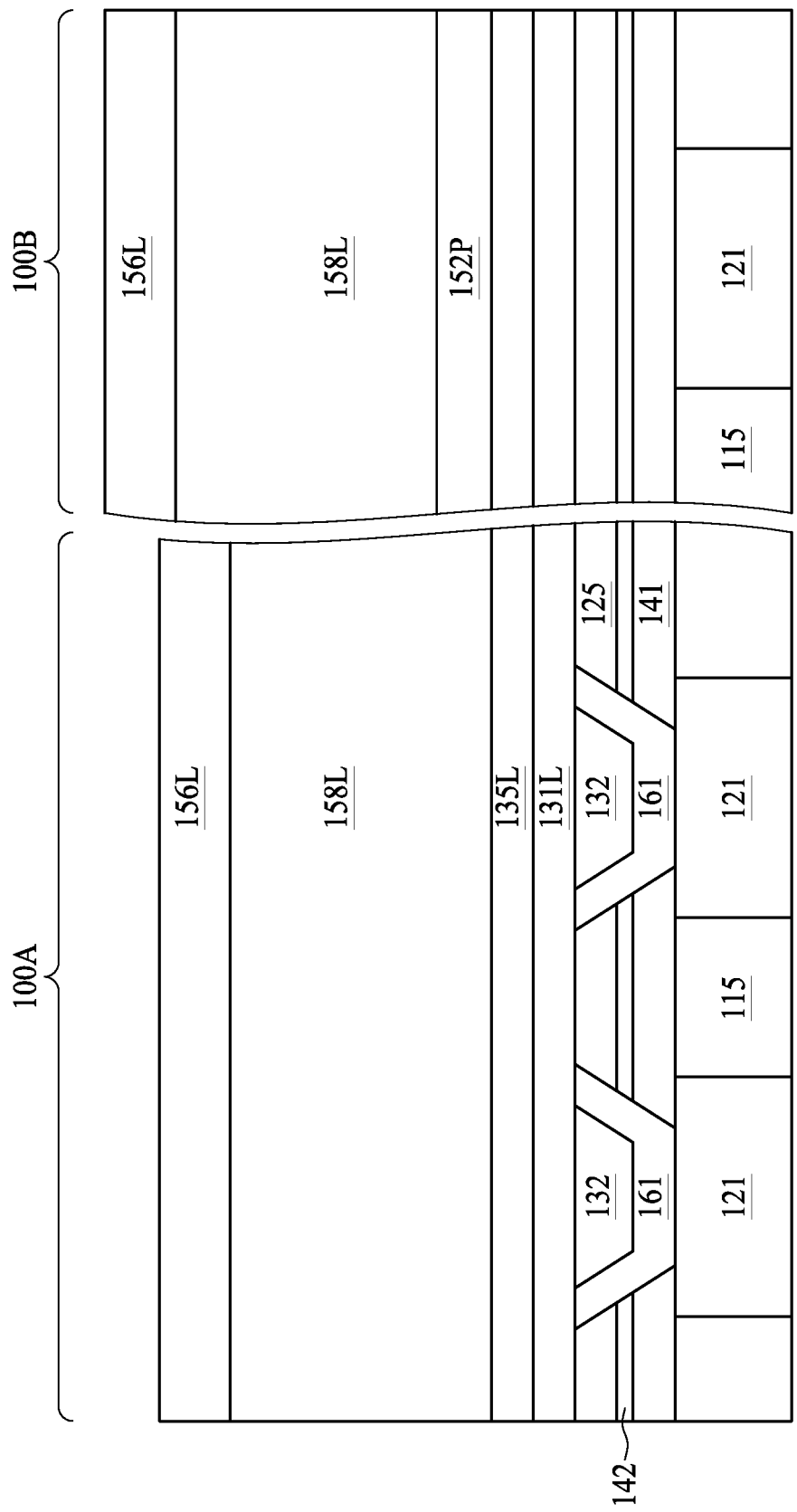

Referring to FIG. 28, a top electrode layer 158L and a mask layer 156L are subsequently formed over the MTJ layer 135L and the patterned sacrificial layer 152P. The top electrode layer 158L is a conductive layer and may include conductive materials similar to the first top electrode layer 133L or the second top electrode layer 154L. The top electrode layer 158L may have a thickness substantially equal to the thickness sum of the first top electrode layer 133L and the second top electrode layer 154L. In some embodiments, the top electrode layer 158L has a thickness between about 50 Å and about 2000 Å, or between about 200 Å and about 1400 Å. The layer formation shown in FIG. 28 is performed in a manner similar to that shown in FIGS. 8 and 9, and repeated descriptions are omitted for brevity.

Figure 29:
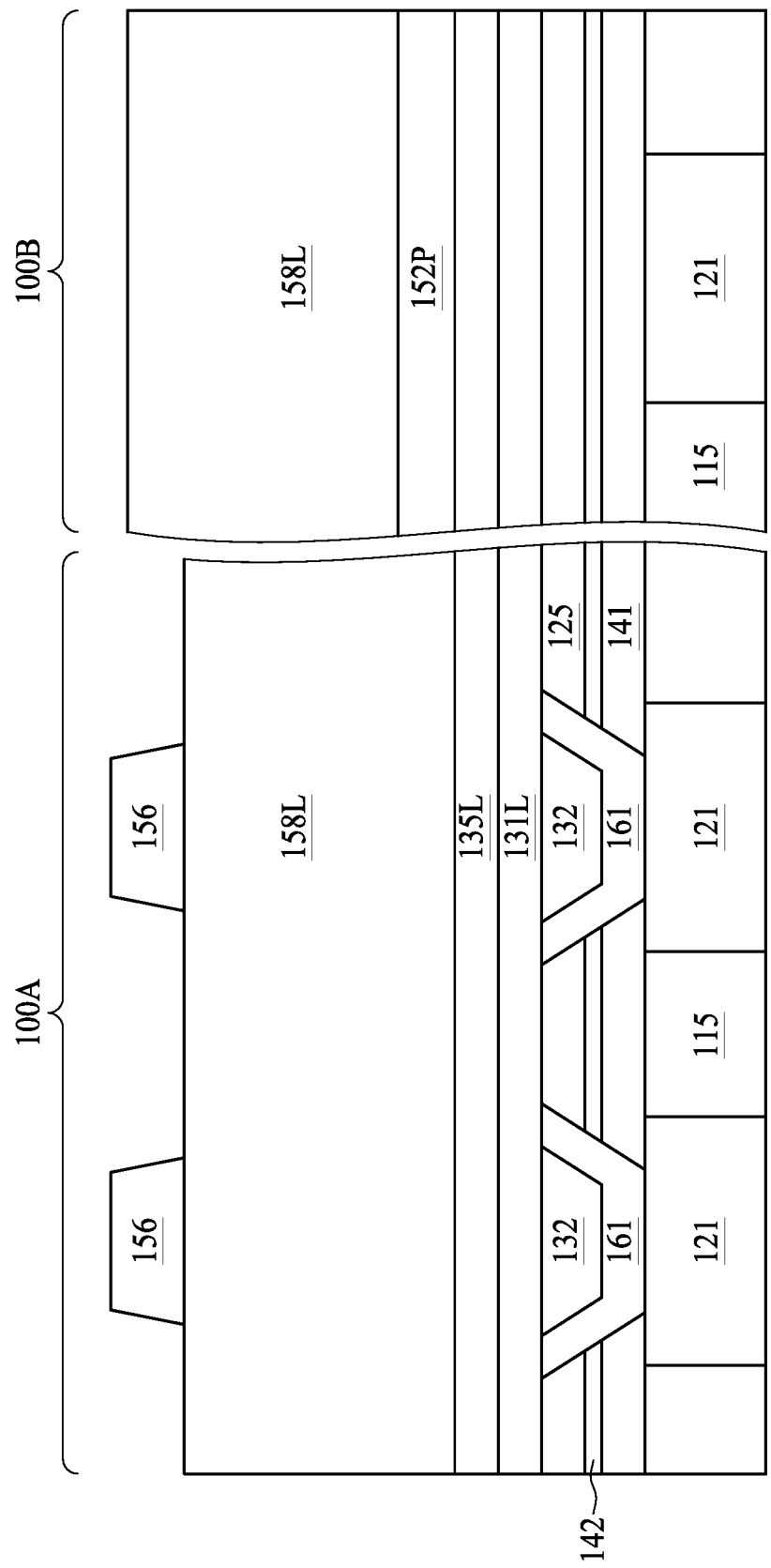
Figure 30:
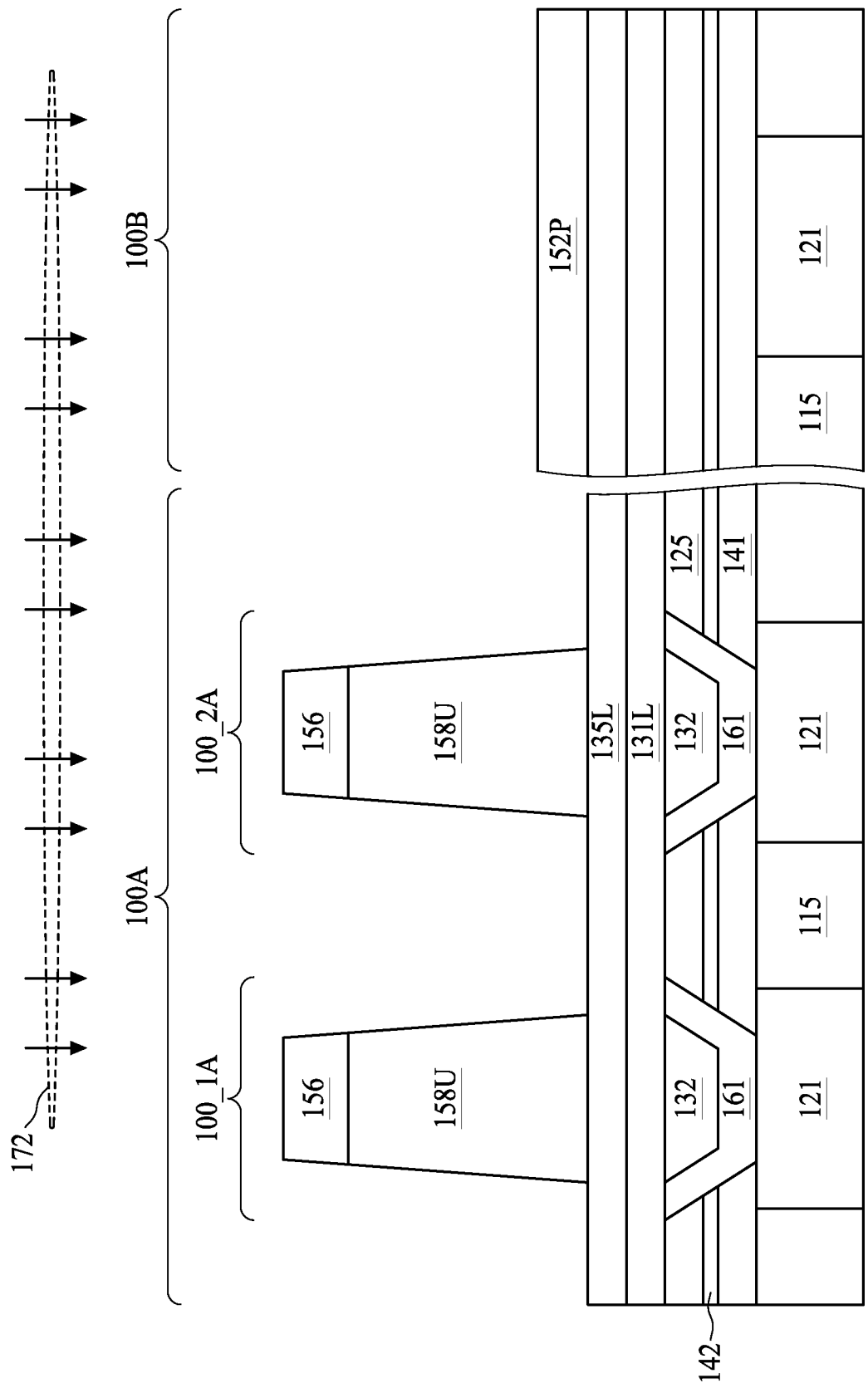

FIG. 29 illustrates the patterning operation of the mask layer 156L. The patterning operation shown in FIG. 29 is performed in a manner similar to that shown in FIG. 12, and repeated descriptions are omitted for brevity. Subsequently, the top electrode portion 158U is formed by etching the top electrode layer 158L using the etching operation 172, as illustrated in FIG. 30. The MTJ layer 135L in the memory region 100A and the patterned sacrificial layer 152P in the logic region 100B are exposed during the patterning operation. The patterning operation 172 shown in FIG. 30 is similar to those shown in FIG. 13, and repeated descriptions are omitted for brevity.

Figure 31:
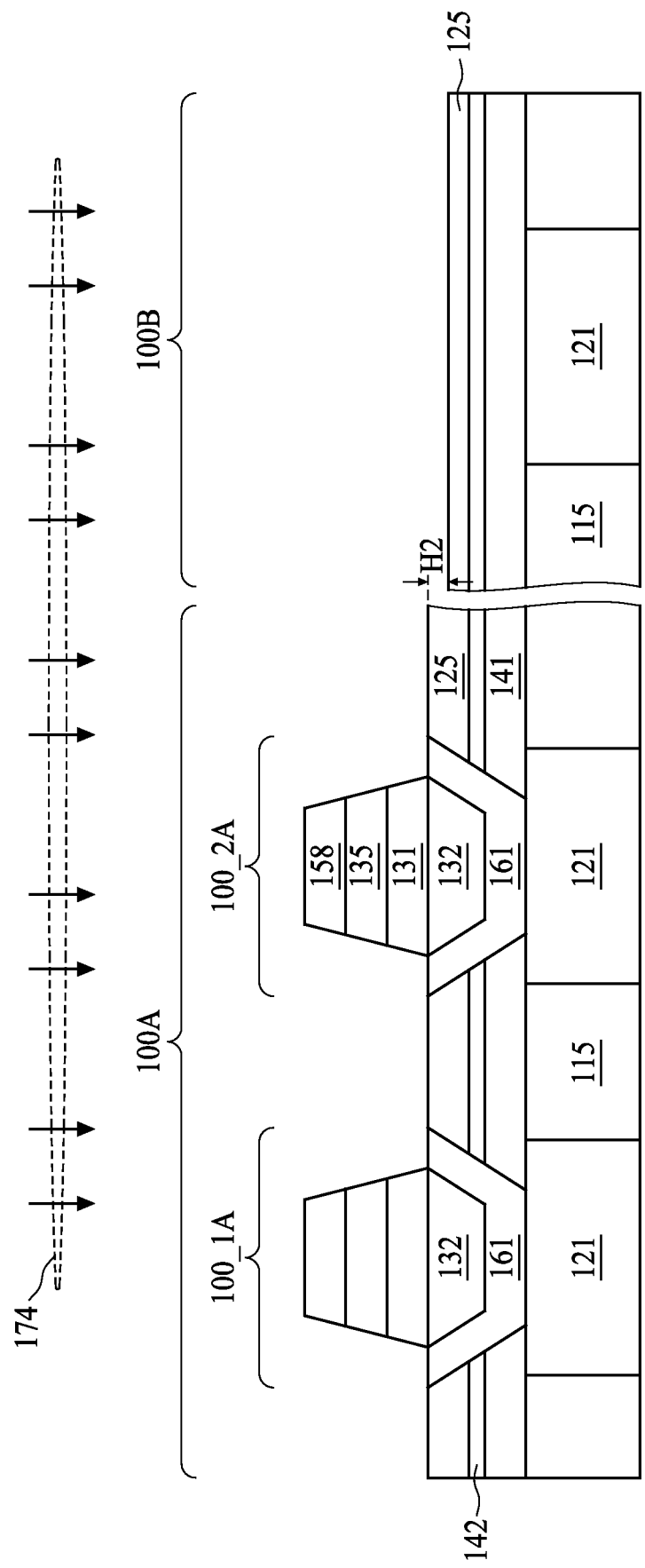

Referring to FIG. 31, the etching operation 174 is performed to etch the MTJ layer 135L and the bottom electrode layer 131L to form discrete units of the top electrodes 158, the MTJs 135 and the bottom electrodes 131 of the respective MRAM structures 100_1A. The etching operation 174 shown in FIG. 31 is similar to those shown in FIG. 14, and repeated descriptions are omitted for brevity. A height difference H2 between the surface of the IMD layer 125 in the memory region 100A and the surface of the IMD layer 125 in the logic region 100B is formed by the etching operation 174. In some embodiments, the height difference H2 is different from the height difference H1 shown in FIG. 14. Referring to FIG. 14 and FIG. 31, the top electrode 158 obtained through the operations in FIGS. 26 to 31 is formed of a single layer resulting from a single deposition operation of the conductive material of the top electrode layer 158L and no interface layers are formed within the top electrode 158.

FIGS. 32 to 36 are cross-sectional views of intermediate stages of manufacturing a semiconductor structure, in accordance with some embodiments of the present disclosure. The operations shown in FIGS. 32 to 35 are performed directly subsequent to the operation shown in FIG. 7 and replace the operations of FIGS. 8 to 14, and are followed by the operations in FIGS. 15 to 25. The materials, method of manufacturing and the configurations of the operations in FIGS. 32 to 36 are similar to those in FIGS. 2 to 9, 10A, 10B and 11 to 25 unless stated otherwise, and repeated descriptions are omitted for brevity.

Figure 32:
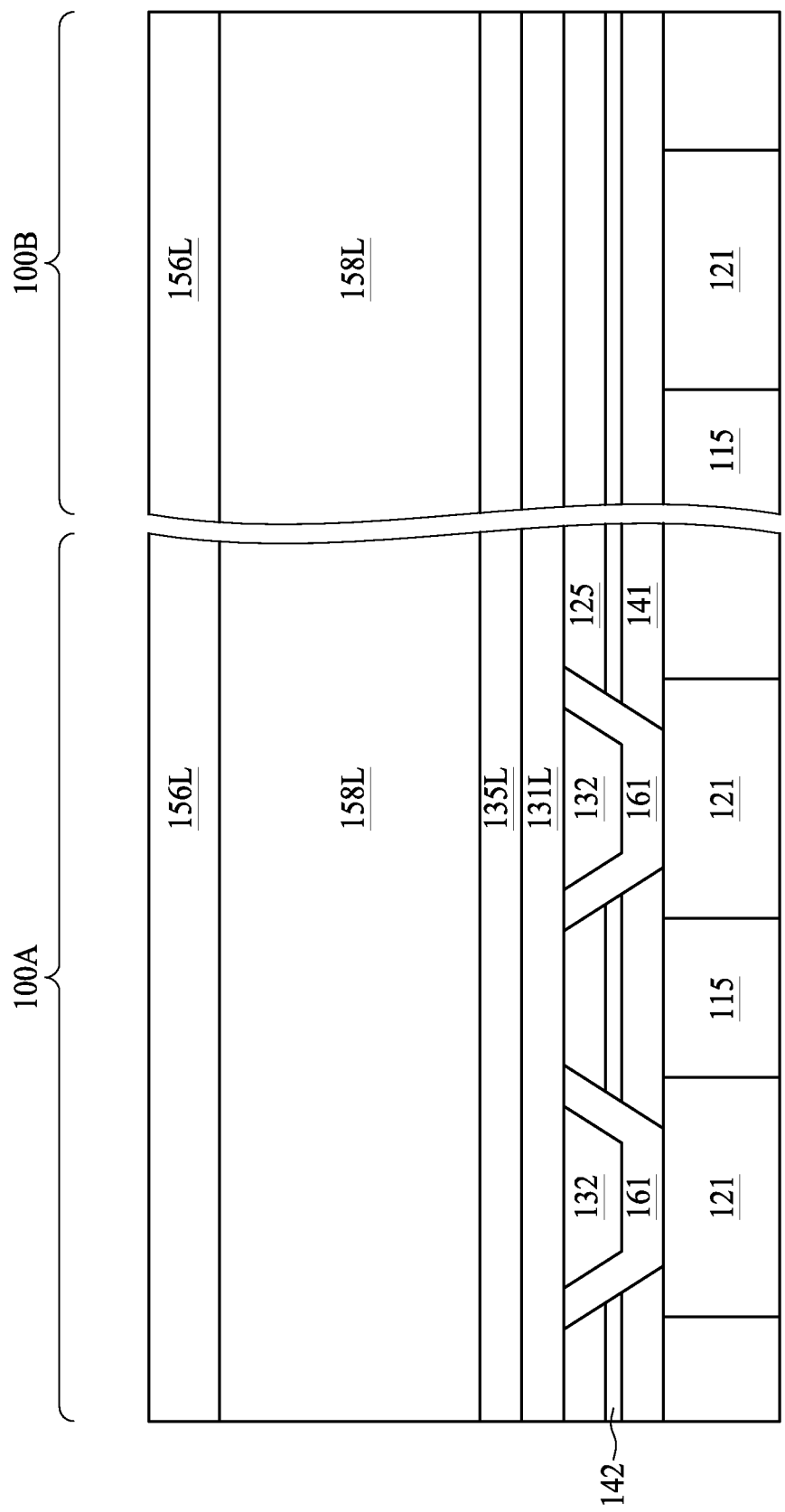
FIGS. 32, 33, 34, 35 and 36 are cross-sectional views of intermediate stages of manufacturing a semiconductor structure, in accordance with some embodiments of the present disclosure.

Referring to FIG. 32, the bottom electrode layer 131L is deposited on the planarized BEVA 132 and the lining layer 161. In some embodiments, a planarization operation, such as CMP, is performed to level the top surface of the bottom electrode layer 131L. The MTJ layer 135L is deposited over the bottom electrode layer 131L. A top electrode layer 158L and a mask layer 156L are subsequently formed over the MTJ layer 135L. The top electrode layer 158L may have a thickness substantially equal to the thickness sum of the first top electrode layer 133L and the second top electrode layer 154L (see FIG. 11). In some embodiments, the top electrode layer 158L has a thickness between about 50 Å and about 2000 Å, or between about 200 Å and about 1400 Å. The layer formation shown in FIG. 32 is performed in a manner similar to that shown in FIG. 8 except for the different thickness of the top electrode layer 158L, and repeated descriptions are omitted for brevity.

Figure 33:
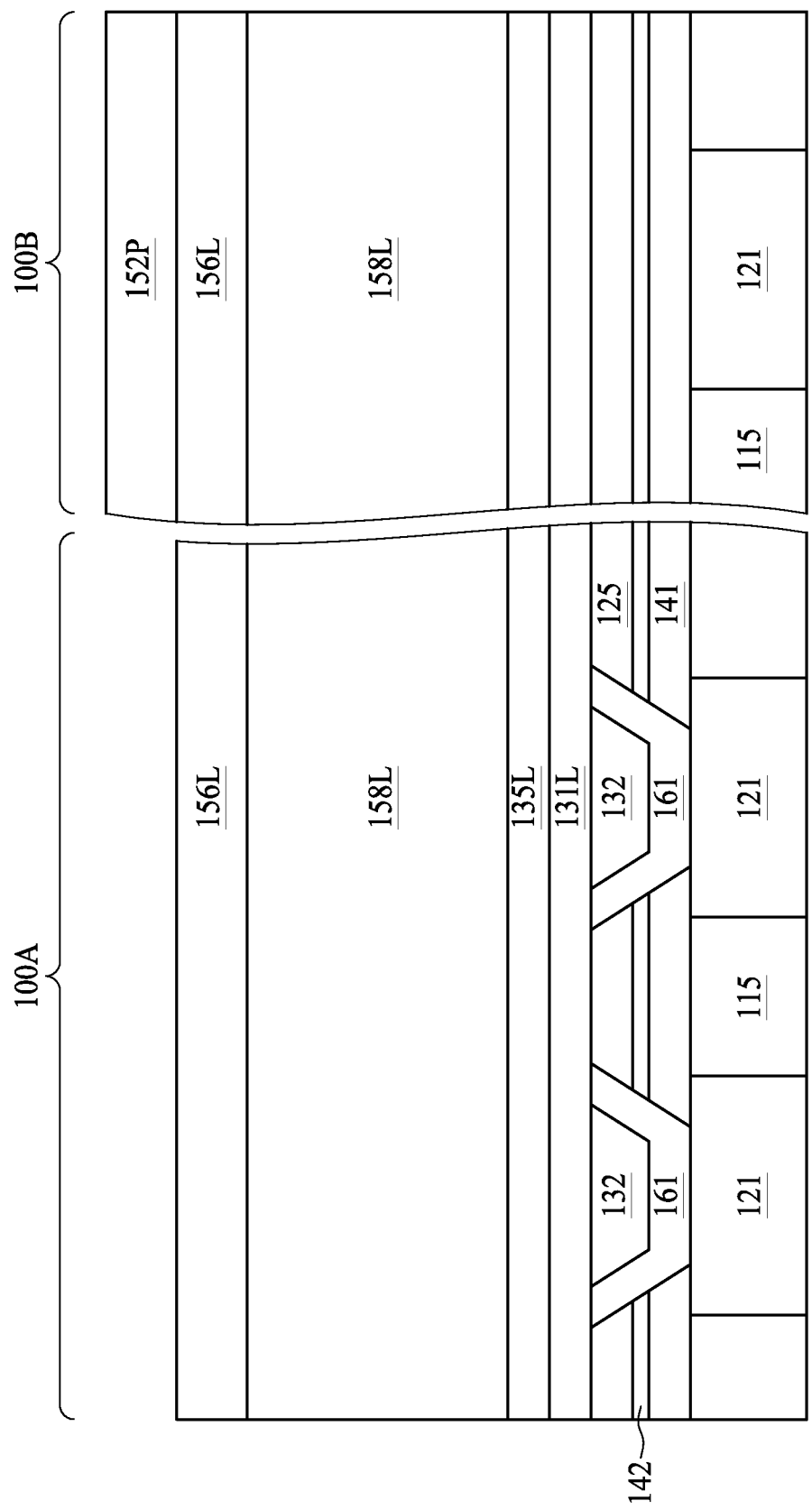

FIG. 33 shows the formation of the patterned sacrificial layer 152P over the mask layer 156L in the logic region 100B. The mask layer 156L is exposed through the patterned sacrificial layer 152P. In some embodiments, the material of the patterned sacrificial layer 152P is the same as or different from that of the mask layer 156L. The patterned sacrificial layer 152P may be formed through photolithographic and etching operation in a manner similar to those shown in FIG. 10A, and repeated descriptions are omitted for brevity.

Figure 34:
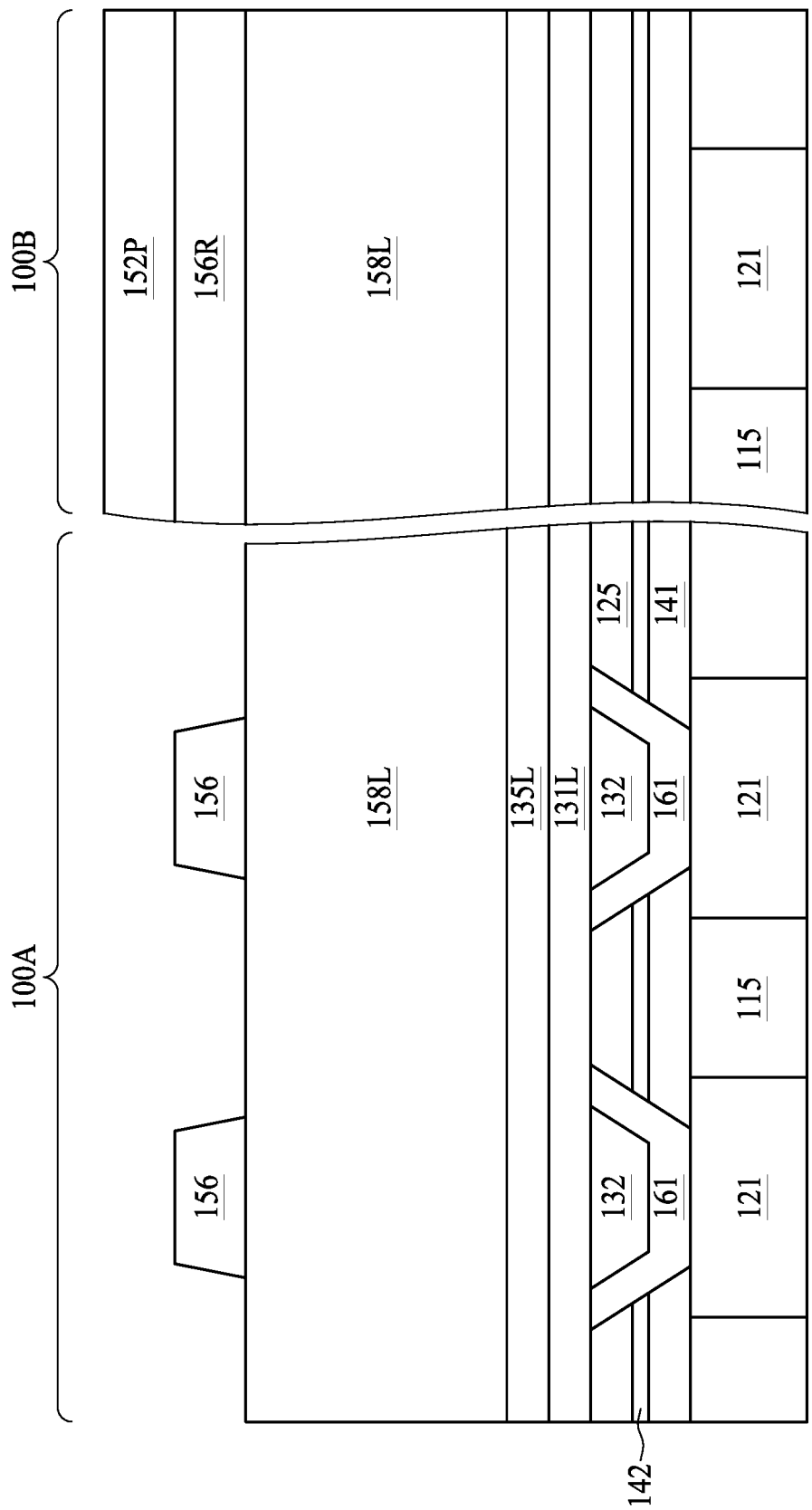

FIG. 34 illustrates a patterning operation on the mask layer 156L to form mask patterns 156 in the memory region 100A. The patterning operation shown in FIG. 34 is performed in a manner similar to that shown in FIG. 12, and repeated descriptions are omitted for brevity. In some embodiments, the patterned sacrificial layer 152P is left during the patterning operation shown in FIG. 34. In this connection, the patterned sacrificial layer 152P and the patterned mask layer 156R in the logic region 100B serves as an etch buffer structure to prevent the subsequent over etch from damaging the underlying Nth metal line 121.

Alternatively, another form of the etch buffer structure is obtained by directly patterning the mask layer 156L to form the patterned mask layer 156R without the additional step of depositing the sacrificial layer 152L. In this regard, the single patterned mask layer 156R serves as the etch buffer structure and the operation of FIG. 33 can be omitted.

Figure 35:
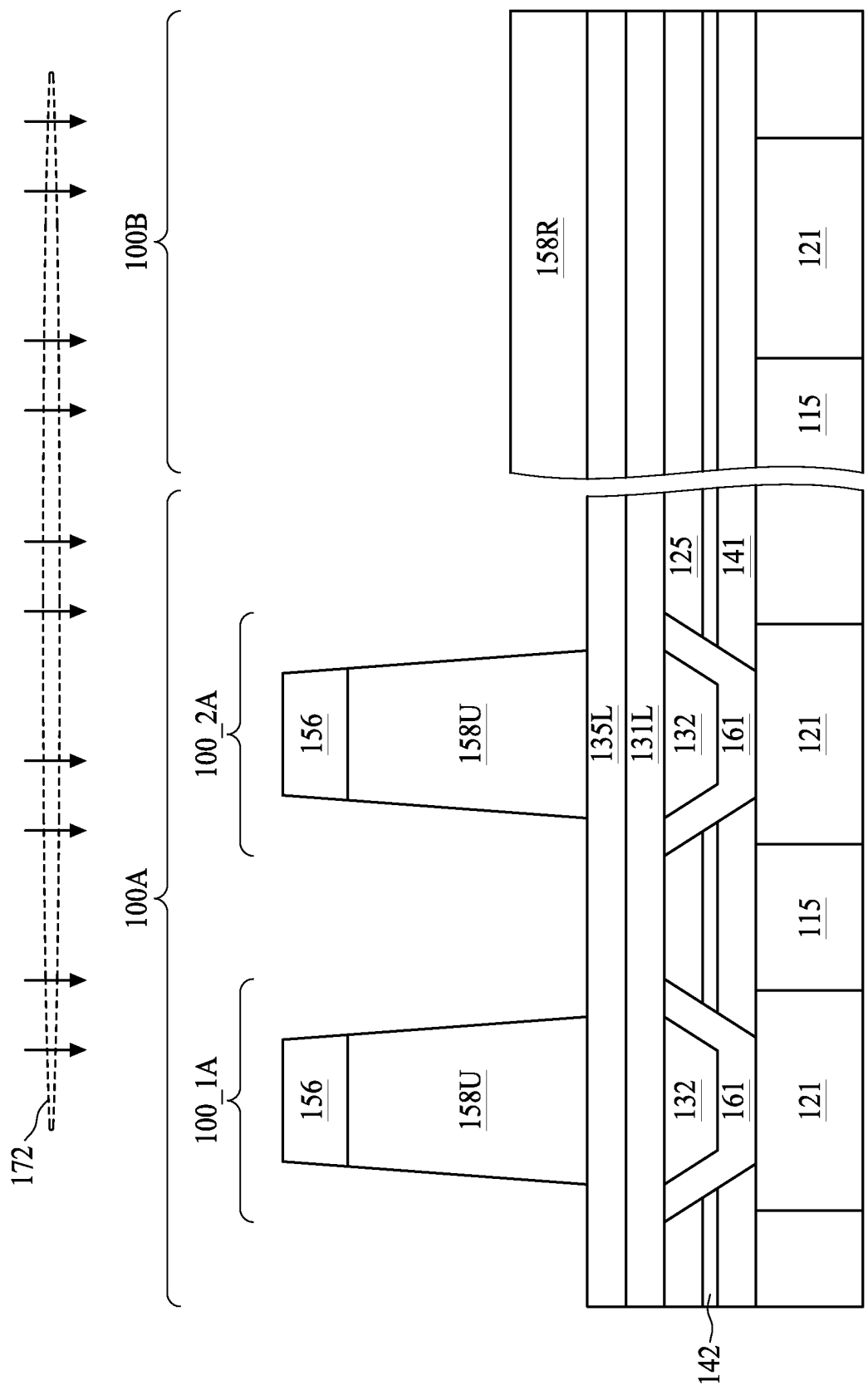

Subsequently, the top electrode portion 158U is formed by etching the top electrode layer 158L using the etching operation 172, as illustrated in FIG. 35. The MTJ layer 135L in the memory region 100A is exposed during the patterning operation 172. The patterned sacrificial layer 152P and the patterned mask layer 156R in the logic region 100B are removed. An upper portion of the top electrode layer 158L in the logic region 100B is removed and a lower portion of the top electrode layer 158R adjacent to the MTJ layer 135L is remained during the etching operation 172 due to the presence of the etch buffer structure formed of the patterned sacrificial layer 152P and/or the patterned mask layer 156R. The patterning operation 172 shown in FIG. 35 is similar to those shown in FIG. 13, and repeated descriptions are omitted for brevity.

Figure 36:
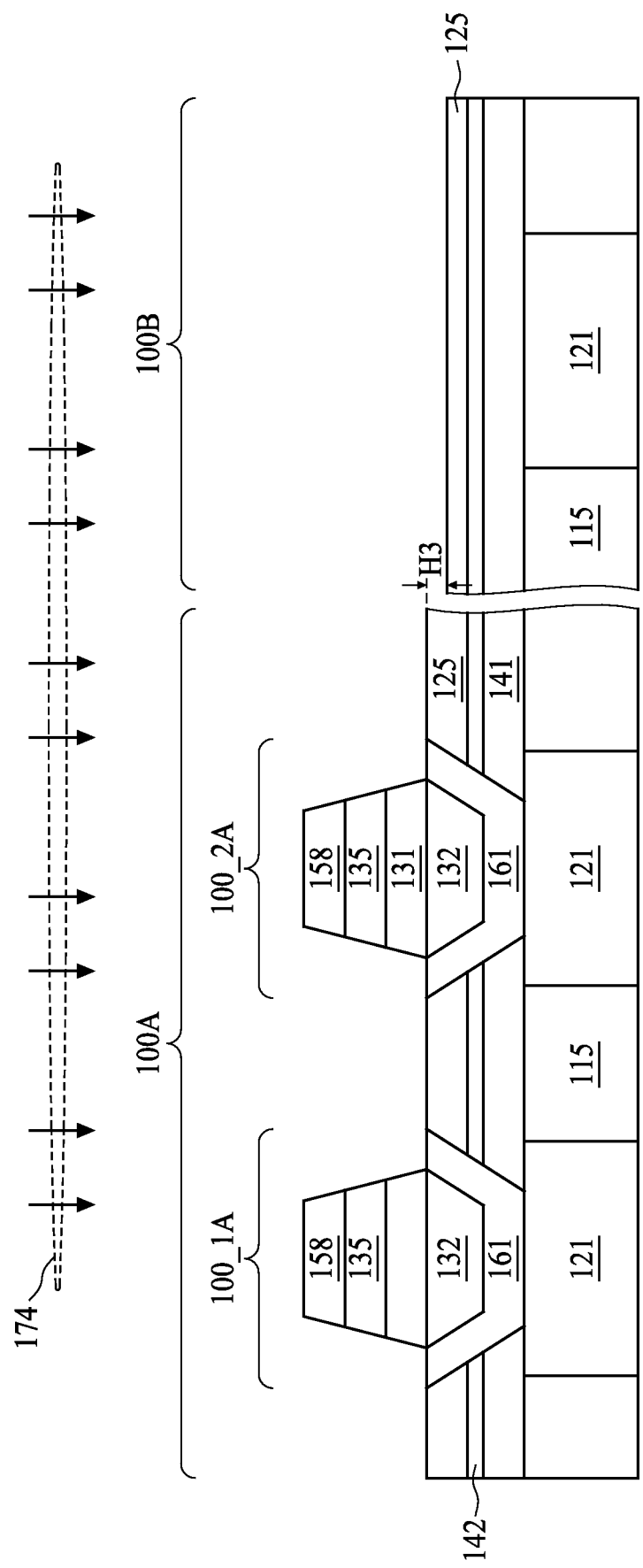

Referring to FIG. 36, the etching operation 174 is performed to etch the MTJ layer 135L and the bottom electrode layer 131L to form discrete units of top electrodes 158, MTJs 135 and bottom electrodes 131 of the respective MRAM structures 100_1A. The etching operation 174 shown in FIG. 36 is similar to those shown in FIG. 14, and repeated descriptions are omitted for brevity. The etching operation 174 performed in FIG. 36 also removes the remained top electrode layer 158R before it removes the underlying MTJ layer 135, the bottom electrode layer 131L, and optionally a thickness of the IMD layer 125 or the barrier layer 142. A height difference H3 between the surface of the IMD layer 125 in the memory region 100A and the surface of the IMD layer 125 in the logic region 100B is formed by the etching operation 174. In some embodiments, the height difference H3 is different from the height differences H1 (FIG. 14) and H2 (FIG. 31). Referring to FIG. 14 and FIG. 36, the top electrode 158 obtained through the operations in FIGS. 32 to 36 is formed of a single layer resulting from a single deposition operation of the conductive material and no interface layers are present within the top electrode 158.

According to an embodiment, a method of manufacturing a semiconductor device includes: providing a substrate, wherein the substrate defines a logic region and a memory region; depositing a bottom electrode layer across the logic region and the memory region; depositing a magnetic tunnel junction (MTJ) layer over the bottom electrode layer; depositing a first conductive layer over the MTJ layer; depositing a sacrificial layer over the first conductive layer; etching the sacrificial layer in the memory region to expose the first conductive layer in the memory region while keeping the first conductive layer in the logic region covered; depositing a second conductive layer in the memory region and the logic region; patterning the second conductive layer to expose the MTJ layer in the memory region; and etching the patterned second conductive layer and the MTJ layer to form a top electrode and an MTJ, respectively, in the memory region. In one or more of the foregoing and following embodiments, prior to the depositing of the bottom electrode layer, a metal line layer having a metal line is formed, a first dielectric layer is deposited in the memory region and the logic region over the metal line layer, and a bottom electrode via is formed within the first dielectric layer in the memory region. In one or more of the foregoing and following embodiments, etching the patterned second conductive layer and the MTJ layer to form a top electrode and an MTJ, respectively, in the memory region comprises reducing a thickness of the first dielectric layer in the logic region. In one or more of the foregoing and following embodiments, the metal line is covered by the first dielectric region in the logic region upon completion of etching the thickness of the first dielectric layer. In one or more of the foregoing and following embodiments, patterning the second conductive layer to expose the MTJ layer in the memory region comprises removing the second conductive layer in the logic region. In one or more of the foregoing and following embodiments, a mask layer is further deposited over the second conductive layer. Patterning the second conductive layer to expose the MTJ layer in the memory region includes patterning the mask layer, and the second conductive layer is patterned using the patterned mask layer as an etch mask. In one or more of the foregoing and following embodiments, the mask layer comprises a same material as a material in the sacrificial layer. In one or more of the foregoing and following embodiments, etching the patterned second conductive layer and the MTJ layer to form a top electrode and an MTJ, respectively, in the memory region comprises performing an ion bombardment etching to remove an entirety of the mask layer and a portion of the second conductive layer in the memory region. In one or more of the foregoing and following embodiments, the ion bombardment etching etches the MTJ layer using at least the second conductive layer as an etch mask to form the MTJ in the memory region. In one or more of the foregoing and following embodiments, the ion bombardment etching further etches the bottom electrode layer using the second conductive layer as an etch mask to form a bottom electrode. In one or more of the foregoing and following embodiments, the ion bombardment etching removes the mask layer and the second conductive layer in the logic region. In one or more of the foregoing and following embodiments, a spacer laterally surrounding sidewalls of the top electrode and the MTJ is further formed.

According to an embodiment, a method of manufacturing a semiconductor structure includes: providing a substrate, wherein the substrate defines a logic region and a memory region; depositing a bottom electrode layer and a magnetic tunnel junction (MTJ) layer over the substrate; depositing a first conductive layer over the MTJ layer; depositing an etch buffer layer over the first conductive layer; etching the etch buffer layer in the memory region to expose the first conductive layer in the memory region while keeping the first conductive layer in the logic region covered; depositing a second conductive layer over the first conductive layer and the etch buffer layer in the memory region and the logic region, respectively; depositing a mask layer over the second conductive layer; patterning the mask layer to form a pattern of a top electrode in the memory region; patterning the first and second conductive layers by transferring the pattern to the first and second conductive layers; and etching the mask layer, the patterned first and second conductive layers, the MTJ layer and the bottom electrode layer using an etching operation to form the top electrode, an MTJ and a bottom electrode in the memory region. In one or more of the foregoing and following embodiments, patterning the first and second conductive layers comprises removing the second conductive layer in the logic region. In one or more of the foregoing and following embodiments, the first conductive layer comprises a same conductive material as a conductive material in the second conductive layer. In one or more of the foregoing and following embodiments, an interface layer is caused to be grown on the first conductive layer prior to the depositing of the second conductive layer. In one or more of the foregoing and following embodiments, prior to the depositing of the bottom electrode layer, a dielectric layer is formed across the memory region and the logic region over the substrate, and a bottom electrode via is formed within the dielectric layer. The bottom electrode layer is electrically connected to the bottom electrode via, and the etching operation stops at the dielectric layer in the memory region while removing a thickness of the dielectric layer in the logic region. In one or more of the foregoing and following embodiments, the dielectric layer in the logic region is completely removed subsequent to the etching operation.

According to an embodiment, a semiconductor device, includes a substrate and a memory device. The semiconductor device includes a memory region and a logic region. The memory device is arranged in the memory region over the substrate and includes a bottom electrode via arranged over the substrate, a bottom electrode arranged over the bottom electrode via, a magnetic tunneling junction (MTJ) arranged over the bottom electrode, and a top electrode arranged over the MTJ. The top electrode includes an upper portion and a lower portion separated from the upper portion. In one or more of the foregoing and following embodiments, the top electrode further comprises an interface layer between the upper portion and the lower portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor device, comprising:
   providing a substrate, the substrate comprising a logic region and a memory region;
   depositing a bottom electrode layer across the logic region and the memory region;
   depositing a magnetic tunnel junction (MTJ) layer over the bottom electrode layer;
   depositing a sacrificial layer over the MTJ layer;
   etching and removing the sacrificial layer in the memory region to expose the MTJ layer in the memory region, while keeping the MTJ layer in the logic region covered;
   depositing a first conductive layer in the memory region and the logic region after etching the sacrificial layer such that the first conductive layer is in contact with the MTJ layer in the memory region and the sacrificial layer separates the MTJ layer from the first conductive layer in the logic region;
   patterning the first conductive layer to expose the MTJ layer in the memory region; and
   patterning the MTJ layer and the bottom electrode layer using the patterned first conductive layer as an etching mask to form a MTJ cell structure in the memory region.

2. The method according to claim 1, further comprising, prior to the depositing of the bottom electrode layer:
   forming a metal line layer having a metal line;
   depositing a first dielectric layer in the memory region and the logic region over the metal line layer; and
   forming a bottom electrode via within the first dielectric layer in the memory region.

3. The method according to claim 2, wherein during the MTJ layer and the bottom electrode layer being patterned in the memory region, a thickness of the first conductive layer is reduced.

4. The method according to claim 3, wherein the metal line is covered by the first dielectric layer in the logic region upon completion of patterning the MTJ layer and the bottom electrode layer.

5. The method according to claim 1, wherein patterning the first conductive layer to expose the MTJ layer in the memory region comprises removing the first conductive layer in the logic region.

6. The method according to claim 1, further comprising depositing a mask layer over the first conductive layer, wherein patterning the first conductive layer to expose the MTJ layer in the memory region comprises patterning the mask layer, and wherein the first conductive layer is patterned using the patterned mask layer as an etch mask.

7. The method according to claim 6, wherein the mask layer comprises a same material as a material in the sacrificial layer.

8. The method according to claim 6, wherein the patterning the MTJ layer and the bottom electrode layer in the memory region comprises performing an ion bombardment etching to remove an entirety of the mask layer and a portion of the first conductive layer in the memory region.

9. The method according to claim 8, wherein the ion bombardment etching etches the MTJ layer using at least the first conductive layer as an etch mask to form the MTJ structure in the memory region.

10. The method according to claim 9, wherein the ion bombardment etching further etches the bottom electrode layer using the first conductive layer as an etch mask to form a cell bottom electrode.

11. The method according to claim 8, wherein the ion bombardment etching removes the mask layer and the first conductive layer in the logic region.

12. The method according to claim 1, further comprising forming a spacer laterally surrounding sidewalls of the MTJ structure.

13. A method of manufacturing a semiconductor device, comprising:
   forming a substrate, the substrate comprising a logic region and a memory region;
   depositing a bottom electrode layer and a magnetic tunnel junction (MTJ) layer over the substrate;
   depositing an etch buffer layer over the MTJ layer;
   etching and removing the etch buffer layer in the memory region to expose the MTJ layer in the memory region, while keeping the MTJ layer in the logic region covered;
   depositing a first conductive layer over the MTJ layer in the memory region and over the etch buffer layer in the logic region after etching the etch buffer layer such that the first conductive layer is in contact with the MTJ layer in the memory region and the etch buffer layer separates the MTJ layer from the first conductive layer in the logic region;
   depositing a mask layer over the first conductive layer;
   patterning the mask layer to form a pattern of a top electrode in the memory region;
   patterning the first conductive layer by transferring the pattern to the first conductive layer in the memory region; and etching the mask layer, the patterned first conductive layer, the MTJ layer and the bottom electrode layer using an etching operation to form the top electrode, an MTJ and a bottom electrode in the memory region.

14. The method according to claim 13, wherein patterning the first conductive layer comprises removing the first conductive layer in the logic region.

15. The method according to claim 13, wherein the first conductive layer as deposited is thicker than the bottom electrode layer.

16. The method according to claim 13, wherein the etch buffer layer is made of a dielectric material.

17. The method according to claim 13, further comprising, prior to the depositing of the bottom electrode layer:
   forming a dielectric layer across the memory region and the logic region over the substrate; and
   forming a bottom electrode via within the dielectric layer, wherein the bottom electrode layer is electrically connected to the bottom electrode via,
   wherein the etching operation stops at the dielectric layer in the memory region while removing a thickness of the dielectric layer in the logic region.

18. The method according to claim 17, wherein the dielectric layer comprises a layer stack comprising an inter-metallic dielectric layer, and the method further comprises:
   completely removing the inter-metallic dielectric layer in the logic region subsequent to the etching operation.

19. A method of manufacturing a semiconductor device, comprising:
   providing a substrate, the substrate comprising a logic region and a memory region;
   forming a bottom electrode layer across the logic region and the memory region;
   forming a magnetic tunnel junction (MTJ) layer over the bottom electrode layer;
   forming an etch buffer layer over the MTJ layer;
   etching and removing the etch buffer layer in the memory region to expose the MTJ layer in the memory region, while keeping the MTJ layer in the logic region covered;
   forming a first conductive layer in the memory region and the logic region after etching the etch buffer layer such that first conductive layer is in contact with the MTJ layer in the memory region and the etch buffer layer separates the MTJ layer from the first conductive layer in the logic region;
   etching the first conductive layer to expose the MTJ layer in the memory region; and
   etching the first conductive layer, the MTJ layer and the bottom electrode layer to obtain a magnetoresistive random access memory structure including a bottom electrode, an MTJ, and a top electrode having a trapezoid shape,
   wherein a longer parallel side of the trapezoid is the bottom electrode and a shorter parallel side of the trapezoid is the top electrode.

20. The method according to claim 19, further comprising forming a spacer laterally surrounding sidewalls of the top electrode, the MTJ, and the bottom electrode.

* * * * *